United States Patent
Hamada et al.

(10) Patent No.: US 7,816,154 B2
(45) Date of Patent: Oct. 19, 2010

(54) SEMICONDUCTOR DEVICE, A METHOD OF MANUFACTURING A SEMICONDUCTOR DEVICE AND A TESTING METHOD OF THE SAME

(75) Inventors: Kanya Hamada, Tokyo (JP); Tasuke Tanaka, Tokyo (JP); Akira Seito, Tokyo (JP); Yoshiaki Nakajima, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 110 days.

(21) Appl. No.: 12/127,788

(22) Filed: May 27, 2008

(65) Prior Publication Data

US 2008/0303173 A1 Dec. 11, 2008

(30) Foreign Application Priority Data

Jun. 6, 2007 (JP) ............................. 2007-150905
Feb. 5, 2008 (JP) ............................. 2008-024701

(51) Int. Cl.
*H01L 21/66* (2006.01)
*H01L 21/44* (2006.01)

(52) U.S. Cl. ............................ 438/17; 438/18; 438/14; 438/106; 257/E21.531

(58) Field of Classification Search ............. 438/14–15, 438/17–18, 106–107; 257/E21.531, E21.141
See application file for complete search history.

(56) References Cited

U.S. PATENT DOCUMENTS 6,335,565 B1 * 1/2002 Miyamoto et al. .......... 257/686

6,979,905 B2 12/2005 Nishida et al.
2005/0146008 A1 * 7/2005 Miyamoto et al. .......... 257/686
2007/0096287 A1 5/2007 Araki et al.

FOREIGN PATENT DOCUMENTS

| JP | 2004-235352 A | 8/2004 |
| JP | 2006-38678 A | 2/2006 |
| JP | 2007-123454 A | 5/2007 |

* cited by examiner

*Primary Examiner*—Thanh Nguyen
(74) *Attorney, Agent, or Firm*—Miles & Stockbridge P.C.

(57) ABSTRACT

A semiconductor device for SiP or PoP for downsizing, a method of manufacturing it, and a testing method suitable for SiP and PoP in which the simplification of a system and the enhancement of its efficiency are achieved are provided. A first semiconductor device including a first memory circuit determined as non-defective and a second semiconductor device including a second memory circuit and a signal processing circuit carrying out signal processing according to a program, determined as non-defective are sorted. The sorted devices are assembled as an integral semiconductor device. On a board for testing, a clock signal equivalent to the actual operation of the semiconductor device is supplied. A test program for conducting a performance test on the first memory circuit is written from a tester to the second memory circuit of the second semiconductor device. In the signal processing circuit, a performance test is conducted on the first memory circuit according to the written test program in correspondence with the clock signal. The result of failure/no-failure determination in this performance test is outputted to the tester.

11 Claims, 23 Drawing Sheets

SEMICONDUCTOR DEVICE, A METHOD OF MANUFACTURING A SEMICONDUCTOR DEVICE AND A TESTING METHOD OF THE SAME

CROSS-REFERENCE TO RELATED APPLICATIONS

The disclosures of Japanese Patent Application No. 2008-24701 filed on Feb. 5, 2008 and Japanese Patent Application No. 2007-150905 filed on Jun. 6, 2007 including the specification, drawings and abstract are incorporated herein by reference in its entirety.

BACKGROUND OF THE INVENTION

The present invention relates to a semiconductor device, a method of manufacturing a semiconductor device, and a testing method of the semiconductor device, and in particular to a technology effectively applicable to multichip configurations in which a semiconductor chip such as a microcomputer and a semiconductor chip such as a dynamic RAM (Random Access Memory) are mounted in a single package, system-in-package structures, or what is obtained by stacking multiple semiconductor packages in multiple layers.

There has been a trend in advance in semiconductor technology to construct multiple semiconductor chips as a single semiconductor device in a package configuration to construct an electronic system such as a chip for microcomputer or a DRAM chip. When a combination of semiconductor chips closely related to each other, for example, a combination of a microcomputer chip and a dynamic RAM (DRAM) is selected, one system can be mounted in a package and a so-called SiP (System in Package) can be achieved. An example of a semiconductor device in multichip configuration is disclosed in Japanese Unexamined Patent Publication No. 2004-235352. Meanwhile, Japanese Unexamined Patent Publication No. 2006-038678 discloses the application of an on-board ICE (In-Circuit Emulator) module to a burn-in test system and a burn-in test method for chips for microcomputer.

As a semiconductor package in a configuration different from the above-mentioned SiP, there is package on package (PoP) disclosed in Japanese Unexamined Patent Publication No. 2007-123454. The SiP is constructed by mounting multiple chips over one wiring substrate. In contrast to this, the PoP is a system in a stacked package constructed, for example, as follows: a package comprised of a wiring substrate mounted with a microcomputer chip and a package comprised of a wiring substrate mounted with a memory chip are prepared; and these packages are stacked and the chips are coupled together.

[Patent Document 1]
Japanese Unexamined Patent Publication No. 2004-235352
[Patent Document 2]
Japanese Unexamined Patent Publication No. 2006-038678
[Patent Document 3]
Japanese Unexamined Patent Publication No. 2007-123454

SUMMARY OF THE INVENTION

With respect to semiconductor devices such as the above-mentioned SiP, it is required to conduct a test before shipment to check whether or not both the microcomputer chip and the DRAM properly work. This test must be conducted even though a SiP is assembled from screened non-defective chips. Advance in semiconductor technology has provided DRAMs with as large a storage capacity as 256 Mbits even though they are in a single chip. To facilitate testing on a memory circuit having such a large storage capacity, the present inventors considered testing memory circuits as illustrated in FIG. 23. That is, a SiP is provided with an external terminal for testing coupled to the address terminal AD, control terminal CN, and data terminal DT of its memory circuit. Multiple devices SiP1 to SiPn under test are coupled to the address bus, control signal, and data bus provided on a test board. Then the memory circuits of the individual devices SiP1 to SiPn under test are tested directly from a testing device.

However, this involves a problem. When the above-mentioned memory circuit is a high-speed memory circuit such as a double data rate-synchronous dynamic random access memory (hereafter, referred to as DDR-SDRAM), an expensive high-speed testing device must be used. To cope with this, the present inventors considered such a test system as illustrated in FIG. 24 aimed at SiPs having such a high-speed memory circuit. A test board is provided with peripheral circuits comprised of FPGA (Field Programmable Gate Array) in correspondence with devices SiP1 to SiPn under test and flash memories FLH with a test program stored therein. The peripheral circuits take the test programs out of the flash memories FLH on the test board and test the individual devices SiP1 to SiPn under test at an actual operating frequency. They send out the results of tests to the testing device. However, this construction involves a problem. Since the test board is mounted with the above-mentioned peripheral circuits comprised of FPGA, the price of the test board is increased and the number of devices under test that can be mounted over the test board is limited. This degrades the efficiency of testing. This is the same with semiconductor devices of the PoP structure.

An object of the invention is to provide a semiconductor device aimed at SiPs or PoPs for size reduction and a method of manufacturing the semiconductor device. Another object of the invention is to provide a testing method suitable for SiPs or PoPs in which the simplification of a system and the enhancement of its efficiency have been achieved. The above and further objects and novel features of the invention will appear from the description in this specification and the accompanying drawings.

One of embodiments as a method of manufacturing a semiconductor device disclosed in this application is as follows. First semiconductor devices having a first memory circuit are formed. An electrical test is conducted on the first semiconductor devices to sort non-defective items. Second semiconductor devices having a signal processing circuit for performing signal processing according to a program and a second memory circuit are formed. An electrical test is conducted on the signal processing circuits and second memory circuits of the second semiconductor devices to sort non-defective items. The screened first semiconductor devices and second semiconductor devices are integrally constructed and their corresponding terminals are coupled together. The integrally constructed semiconductor devices are mounted over a board for testing and subjected to an electrical test to determine the failure/no-failure of each semiconductor device. In this determination of the failure/no-failure of semiconductor, the above-mentioned board for testing is provided with an oscillation circuit for supplying a clock signal equivalent to the actual operation of the semiconductor devices to the semiconductor devices in common. In first operation, a test program is written to the second memory circuit of each second semiconductor device from a testing device. This test program is for conducting a performance test on the first memory circuit of each first semiconductor device. In second operation, a performance test is conducted on the first memory circuit of each first semiconductor device by the signal processing circuit of the corresponding second semiconductor device. This performance test is conducted according to the test program, written to the second memory circuit, in accordance with the above clock signal. In third operation, the result of the failure/no-failure determination in the second operation is outputted to the testing device.

One of embodiments as a testing method of a semiconductor device disclosed in this application is as follows. In each semiconductor device, a first semiconductor device and a second semiconductor device are integrally constructed and the semiconductor device has a coupling means for coupling corresponding terminals together. The first semiconductor device has a first memory circuit. The second semiconductor device has a second memory circuit, a signal processing circuit for performing signal processing operation according to a program, an interface circuit that can be coupled with the corresponding first memory circuit, and an interface circuit for user debugging. A board for testing is provided with an oscillation circuit for generating a clock signal equivalent to the actual operation of each semiconductor device, and semiconductor devices are mounted over the board and supplied with the above clock signal. In first operation, a test program is written to the second memory circuit of each second semiconductor device from the testing device through the interface circuit for user debugging. This test program is for conducting a performance test on each first memory circuit. In second operation, a performance test is conducted on each first memory circuit by the signal processing circuit. This performance test is conducted according to the written test program in accordance with the above clock signal. In third operation, the result of the failure/no-failure determination in the second operation is outputted to the testing device.

One of embodiments of a semiconductor device disclosed in this application is as follows. The semiconductor device is integrally constructed by coupling together the corresponding terminals of a first semiconductor device and a second semiconductor device. The first semiconductor device has a first memory circuit. The second semiconductor device has a second memory circuit, a signal processing circuit for performing signal processing operation according to a program, an interface circuit that can be coupled with the first memory circuit, and an interface circuit for user debugging. A memory test program for the first memory circuit can be stored in the second memory circuit using the interface circuit for user debugging. There is not an external terminal for directly accessing the first memory circuit of the first semiconductor device.

Since a microcomputer chip tests a memory chip according to a program written to its embedded memory circuit, an external terminal for testing is unnecessary. Thus it is possible to achieve the downsizing of semiconductor devices aimed at SiP or PoP and the simplification of a test system and the enhancement of its efficiency.

DETAILED DESCRIPTION OF THE PREFERRED EMBODIMENTS

Figure 1:
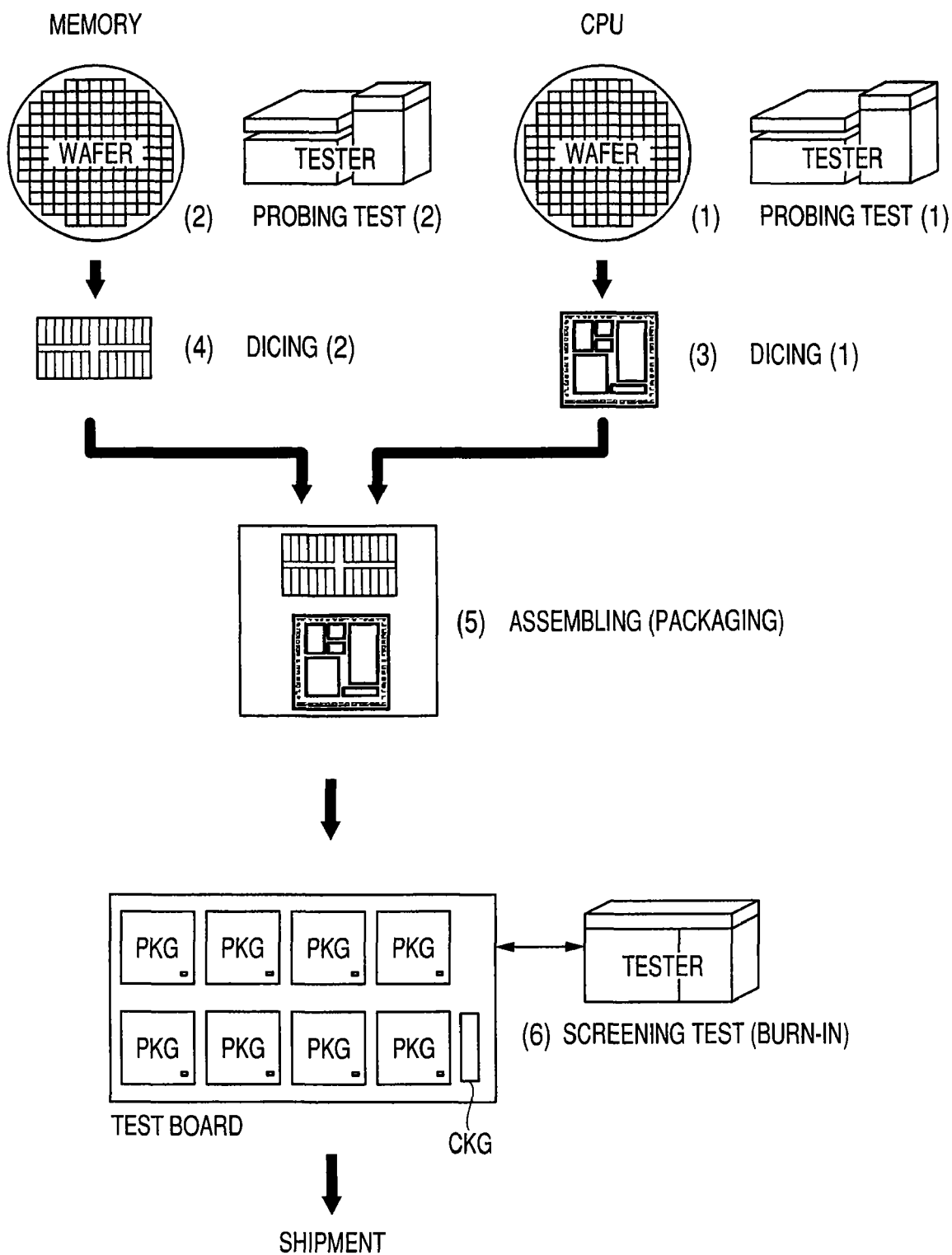
FIG. 1 is a schematic process drawing of an embodiment of a method of manufacturing a semiconductor device of the invention.

FIG. 1 is a schematic process drawing explaining an embodiment of a method of manufacturing a semiconductor device of the invention. In Process (1), multiple CPU chips are formed over a semiconductor wafer. When the CPU chips have been formed over the semiconductor wafer as mentioned above, a probing test (1) is conducted by a tester. These CPU chips have a memory circuit described later and an interface circuit for user debugging used in self-diagnosis and the like.

In Process (2), multiple memory chips are formed over a semiconductor wafer similarly with the foregoing. These memory chips have a large storage capacity and perform high-speed operation like DDR-SDRAMs, for example. When the memory chips have been formed over the semiconductor wafer as mentioned above, a probing test (2) is conducted by a tester.

In Process (3), the semiconductor wafer with the above CPU chips formed thereover is subjected to dicing (1), and the CPU chips determined as non-defective in the above probing test (1) are sorted.

In Process (4), the semiconductor wafer with the above memory chips formed thereover is subjected to dicing (2), and the memory chips determined as non-defective in the above probing test (2) are sorted.

In Process (5), a CPU chip determined as non-defective in the above Process (3) and a memory chip determined as non-defective in the above Process (4) are mounted over one mounting substrate. They are coupled together through the internal wiring formed in the mounting substrate and further coupled to external terminals. Then the chips and the like are sealed with resin using one mold and assembled as a single semiconductor device in terms of appearance.

In Process (6), a screening test is conducted on these assembled SiPs. Burn-in is simultaneously conducted as required. The test board used in this screening test is mounted with a clock generation circuit CKG, which supplies a high-speed clock signal equivalent to actual operation to the semiconductor devices (PKG) of the SiP configuration as devices under test attached to sockets for testing. A tester accesses the CPU chips of the multiple devices PKG under test mounted over the test board through the above-mentioned interface circuits for user debugging. Then it writes a test program for the memory chips to the memory circuits embedded therein. Thereafter, the tester starts the CPU chips and accesses the memory chips according to the program stored in the above embedded memory. Thus the results of failure/no-failure determination are obtained and transferred to the tester. The CPU chips themselves are also tested as follows: an ICE (In-Circuit Emulator) module is accessed through the interface circuit for user debugging and a peripheral circuit including CPU and the above embedded memory circuit is tested. SiPs whose CPU chip and memory chip are determined as non-defective from the test result are shipped.

In the screening test in this embodiment, the memory test is conducted as follows: the CPU chip tests the memory chip by repeating writing/reading to/from a memory cell in accordance with the above clock signal as the above SiP actually operates. The program for this test is simultaneously inputted from the tester to the multiple SiPs mounted over the test board, as mentioned above. In addition, in the SiPs mounted over the test board, their memory chips are concurrently tested according to the respectively inputted program. Therefore, even when the memory circuits have a large storage capacity as mentioned above, the tests can be completed in a short time and all together.

Figure 2A:
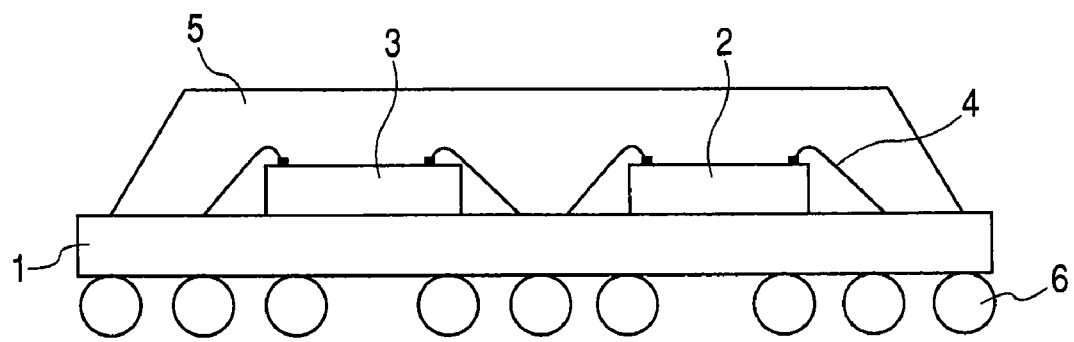
FIG. 2A is an explanatory drawing of an embodiment of SiP of the invention.
Figure 2B:
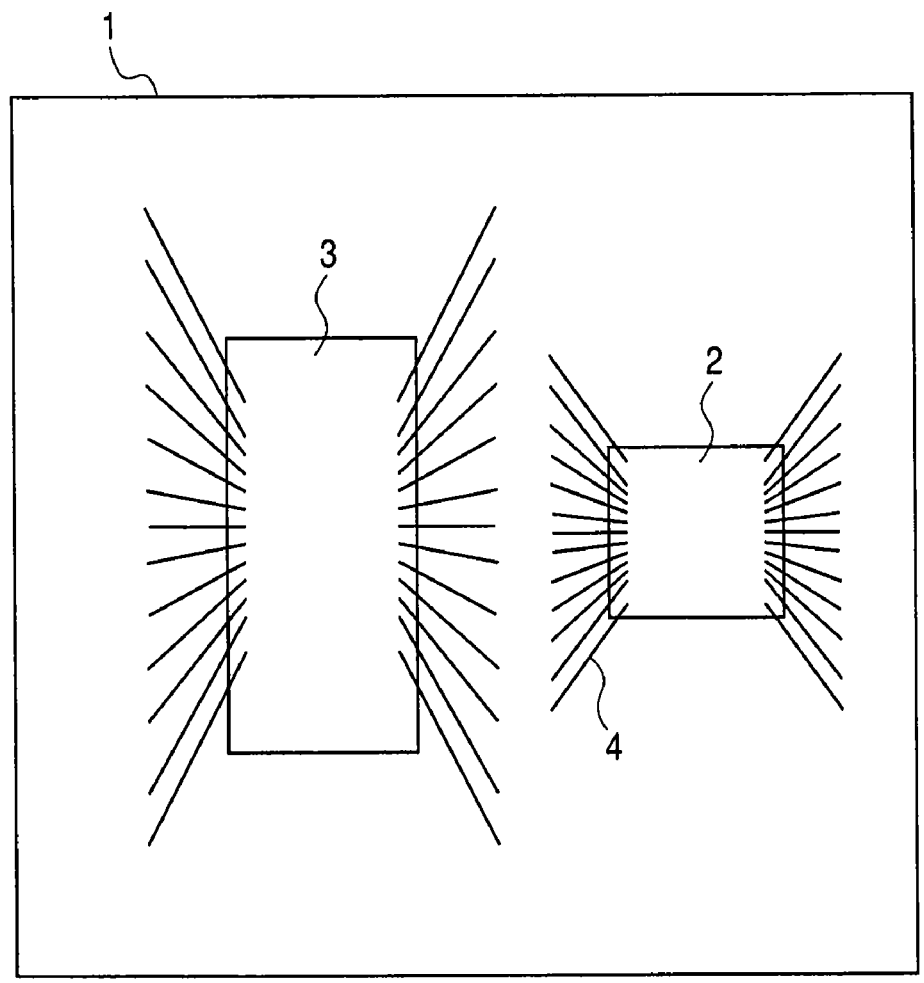
FIG. 2B is an explanatory drawing of this embodiment of SiP of the invention.

FIGS. 2A and 2B are explanatory drawings of an embodiment of SiP of the invention. FIG. 2A schematically illustrates its section, and FIG. 2B illustrates its top face. The above-mentioned microcomputer chip 2 and DDR-SDRAM chip 3 are mounted over a mounting substrate 1. The microcomputer chip 2 and the DDR-SDRAM are mounted over the front face of the mounting substrate 1 and they are each coupled with a wiring pattern formed on the top face of the mounting substrate through a bonding wire 4. The microcomputer chip 2 and the DDR-SDRAM chip 3 are comprised of a so-called bare chip and die-bonded over the mounting substrate.

The microcomputer chip 2 may be provided with multiple bump electrodes that can be surface mounted to the mounting substrate 1. It may be constructed by such a technology as designated as area array pad as required. That is, it may be constructed by: forming a wiring that enables repositioning of pad electrodes (bonding pads) over the circuit formation surface of a semiconductor chip with elements and wirings finished through an insulating film formed of, for example, polyimide resin; and forming pad electrodes (land electrodes for bump connection) on this wiring. The pad electrodes arranged as the external terminals of the microcomputer chip 2 with such a relatively small pitch as several tens of μm to 100 μm by the above area array pad technology are 0.1 mm to 0.2 mm in diameter. Further, they are converted into an arrangement of bump electrodes with such a relatively large pitch as 400 μm to 600 μm.

The mounting substrate 1 is comprised of: an insulating substrate formed of glass epoxy or glass; a relatively fine internal wiring in a multilayer wiring configuration formed over the insulating substrate; and electrodes for the above-mentioned wire bonding. The principal surface of the mounting substrate 1 mounted with the microcomputer chip 2 and the DDR-SDRAM chip is sealed together with bonding wires 4 with a sealing body 5. The back side of the mounting substrate 1 is provided with solder balls 6 as external terminals.

Figure 3:
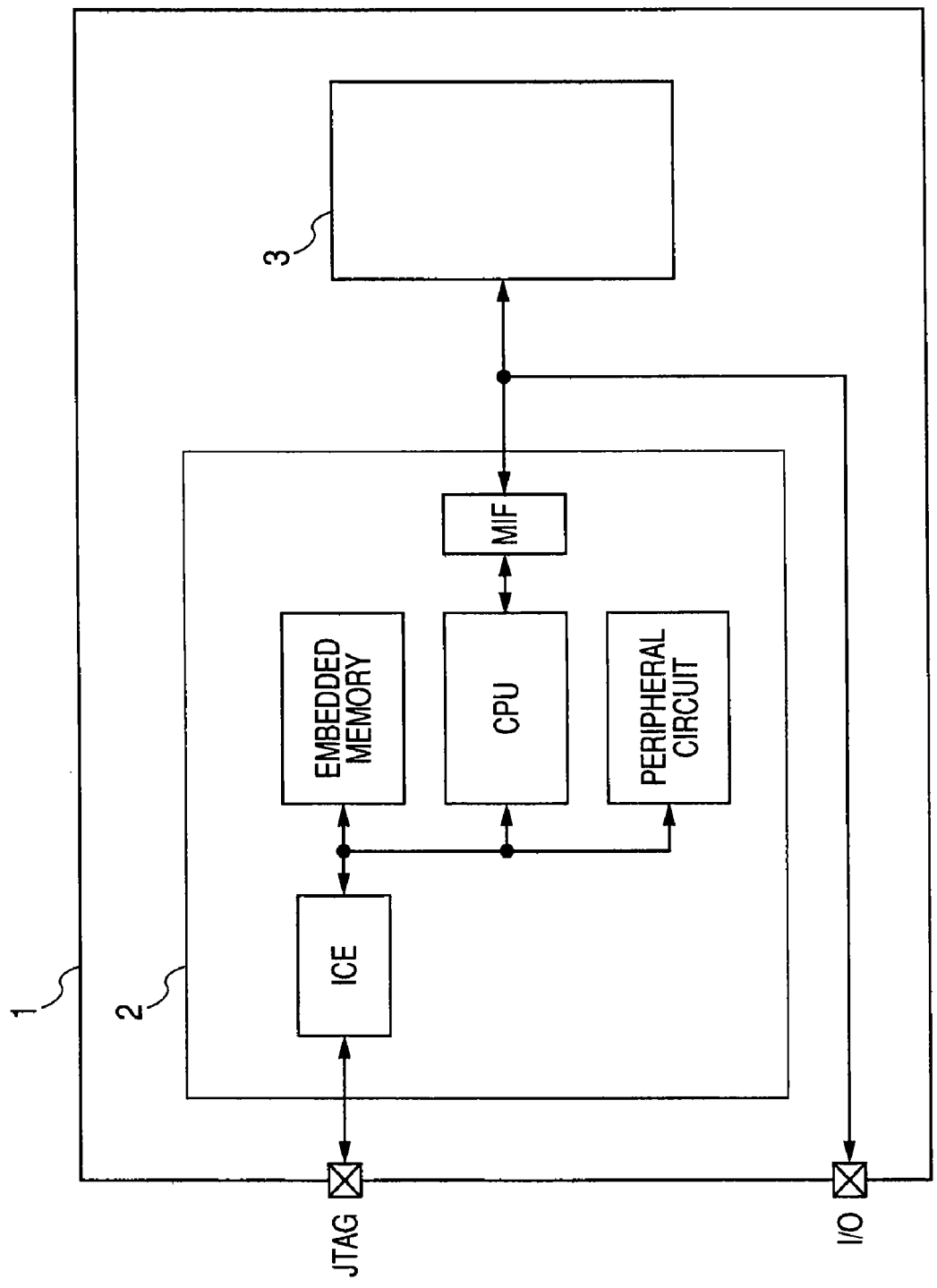
FIG. 3 is an internal block diagram of an embodiment of SiP of the invention.

FIG. 3 is an internal block diagram of an embodiment of SiP of the invention. This drawing is depicted with a focus on parts related to the above-mentioned screening test. The semiconductor device (SiP) 1 in this embodiment is comprised of a microcomputer chip 2 and a memory chip 3. The microcomputer chip 2 includes ICE (In-Circuit Emulator: self-diagnosis circuit) module in addition to CPU (Central Processing Unit). This ICE module has an interface circuit in compliance with the JTAG standard, though not specially limited, and coupled to an external terminal JTAG. The microcomputer chip 2 is provided with a memory interface circuit IMF corresponding to the above memory chip 3, in addition to an embedded memory such as a static RAM and a peripheral circuit. It is directly coupled with the memory chip 3 through the memory interface circuit MIF.

The memory chip 3 is comprised of a high-speed DDR-SDRAM having a large storage capacity, though not specially limited. An input/output terminal I/O is an external terminal provided for single-handedly testing the memory chip 3. This external terminal I/O is not required in the screening test itself of the invention, as mentioned above. However, it can be used, for example, as an input terminal for accessing a memory chip and efficiently conducting burn-in prior to a screening test.

Figure 4:
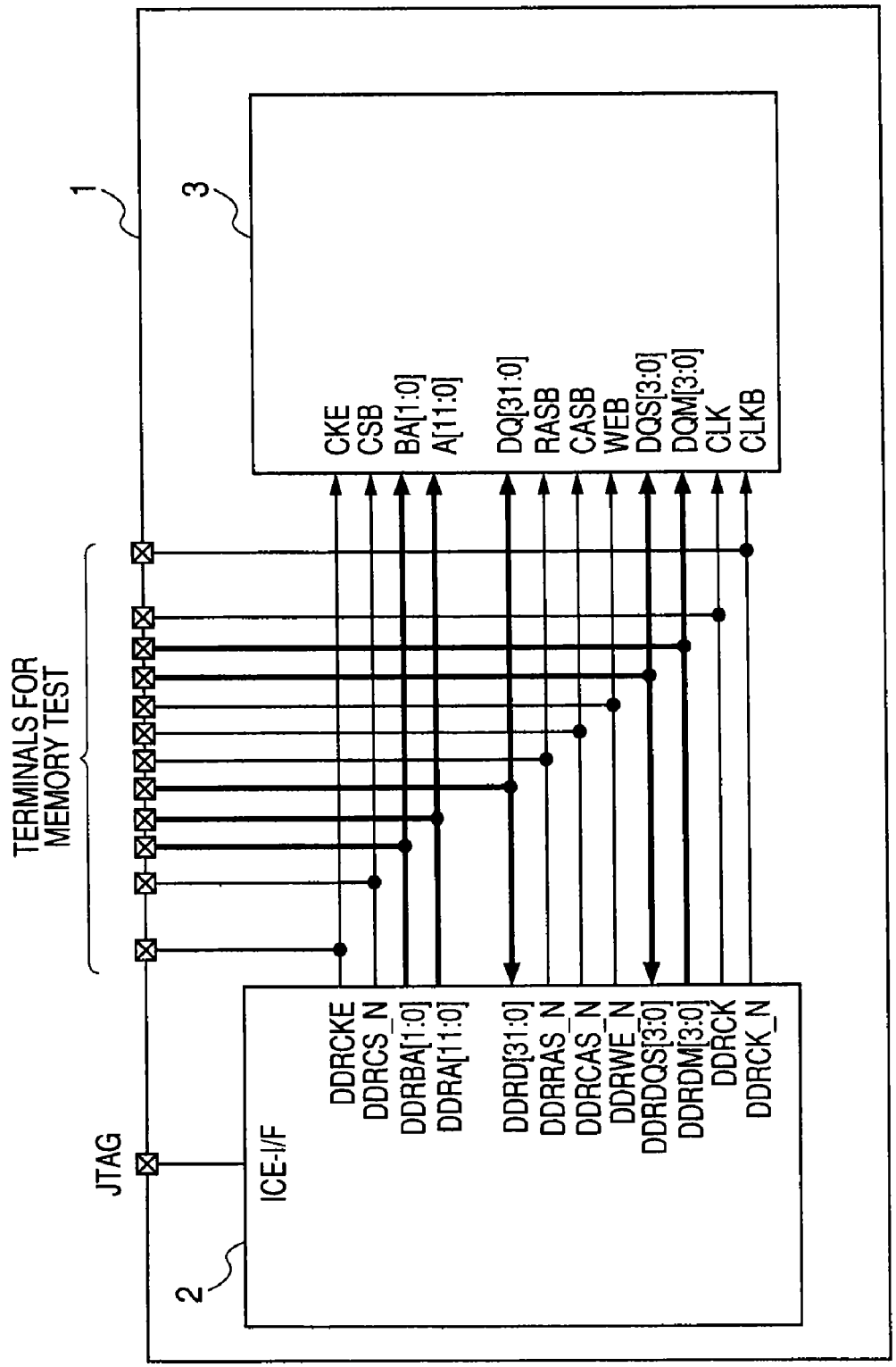
FIG. 4 is an internal block diagram of an embodiment of SiP of the invention.

FIG. 4 is an internal block diagram of an embodiment of SiP of the invention. This drawing is depicted with a focus on the relation of coupling between the microcomputer chip 2 and the memory chip 3. The memory chip 3 is DDR-SDRAM. A terminal CKE is a clock enable input. A terminal CSB is a chip select input. A terminal BA[1:0] is a bank address input. A terminal A[11:0] is an address input. A terminal DQ[31:0] is a data input/output. A terminal RASB is a row address strobe input. A terminal CASB is a column address strobe input. A terminal WEB is a write enable input. A terminal DQS[3:0] is a data strobe input/output. A terminal DQM[3:0] is a DQ write mask enable input. Terminals CLK and CLKB are clock inputs.

The microcomputer chip 2 has the following terminals directly coupled to the above input terminals and input/output terminals of the DDR-SDRAM: output terminals DDRCKE, DDRCS_N DDRBA[1:0], DDRA[11:0], DDRRAS_N, DDRCAS_N, DDRWE_N, DDRRDM[3:0], DDRCK, and DDRCK_N; and input/output terminals DDRD[31:0] and DDRDQS[3:0]. In this drawing, the terminal names suffixed with B, such as CSB, of the memory chip 3 indicate that they are for active-low bar signals. In correspondence therewith, the terminal names suffixed with _N, such as DDRCS_N, of the microcomputer chip 2 indicate that they are for active-low negative signals.

In this embodiment, the semiconductor device 1 such as SiP is provided with terminals for testing coupled to wirings that couple the microcomputer chip 2 and the memory chip 3 together. Use of these terminals for testing makes it possible to directly access the memory chip, for example. The microcomputer chip 2 is provided with the terminal JTAG coupled to the interface circuit for user debugging of the microcomputer chip 2.

Figure 5:
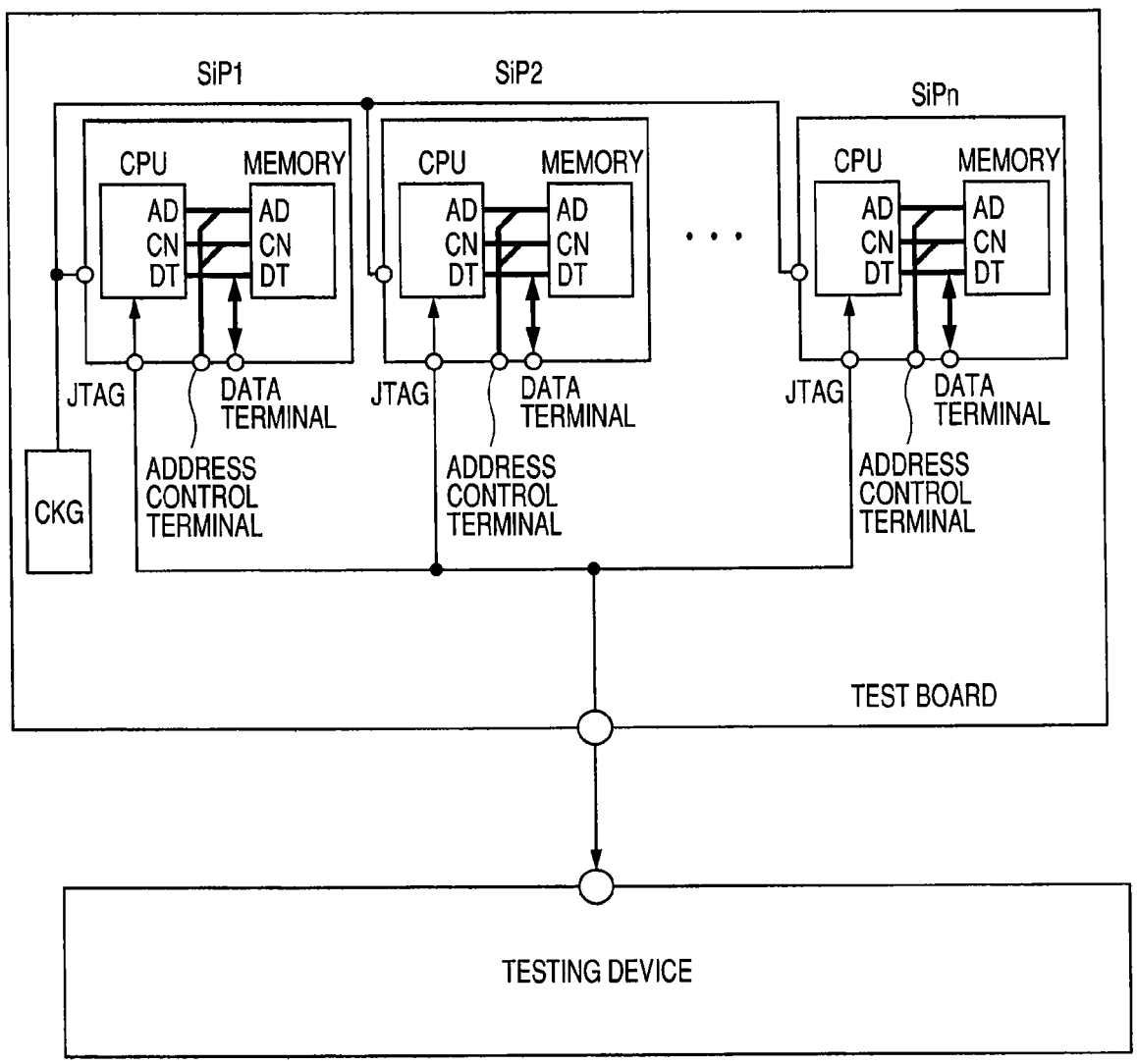
FIG. 5 is a block diagram of an embodiment explaining a screening test for the semiconductor device illustrated in FIG. 4.

FIG. 5 is a block diagram of an embodiment explaining a screening test for the semiconductor device illustrated in FIG. 4. A test board is provided with a clock generation circuit CKG, which supplies a clock signal corresponding to the actual operation of SiP1 to SiPn as devices under test. On the test board, the devices SiP1 to SiPn under test are coupled as follows: their above-mentioned terminals for testing (addresses AD, control CN terminals, and data terminals DT) are not coupled with the tester but their JTAG terminals are coupled with the tester in common.

When burn-in is conducted, the following measure may be taken to identify any initial failure, though not specially limited: an operating voltage higher than an actual operating voltage is supplied, and memory access is made at a frequency lower than in actual operation from the tester in a high-temperature atmosphere using terminals for testing, address AD, control CN terminal, and a data terminal DT. The above terminals for testing are convenient for conducting a direct-current test to check the coupling between a memory chip 14 and a CPU chip 12.

Figure 6:
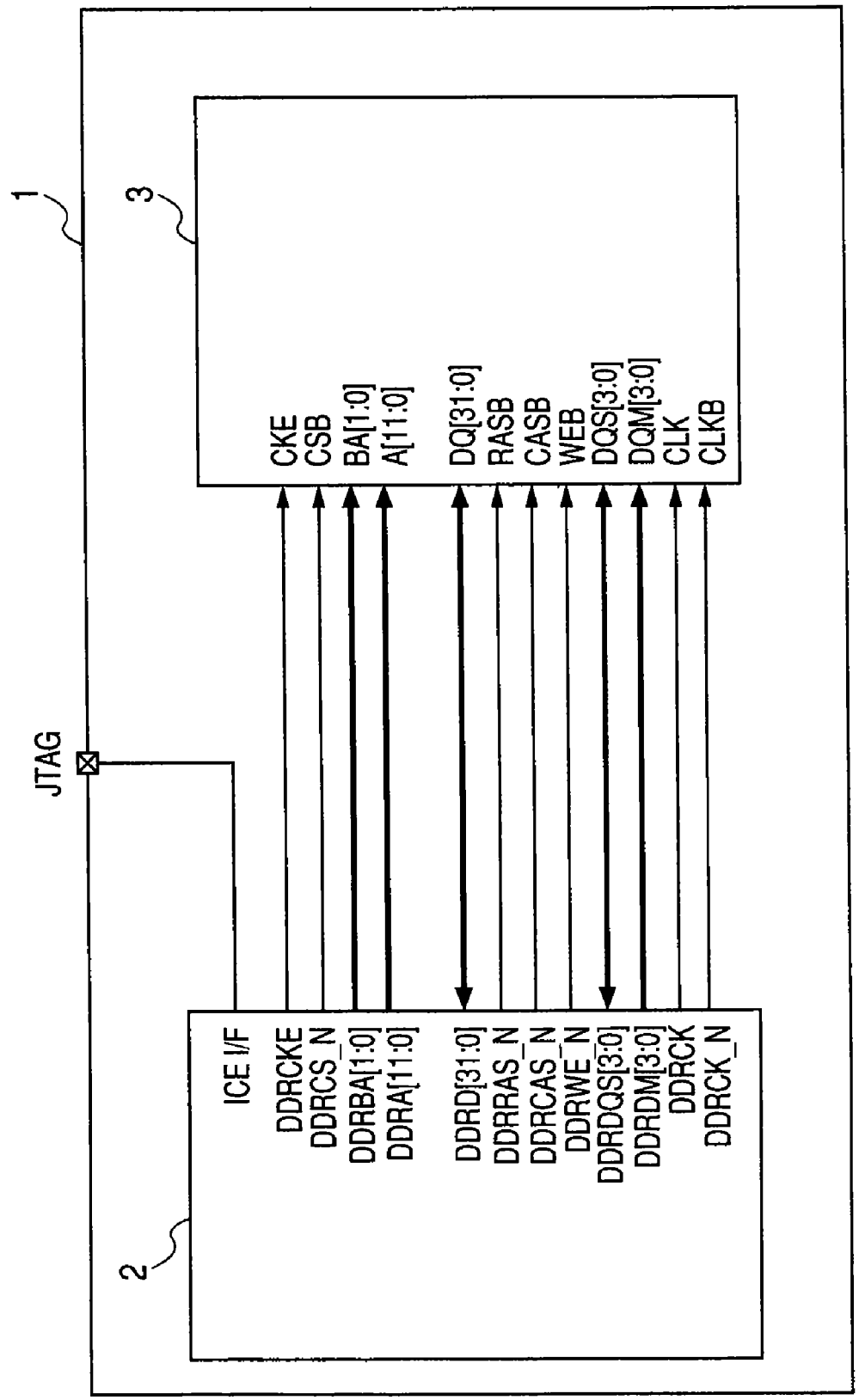
FIG. 6 is an internal block diagram of another embodiment of SiP of the invention.

FIG. 6 is an internal block diagram of another embodiment of SiP of the invention. This drawing is depicted with a focus on the relation of coupling between the microcomputer chip 2 and the memory chip 3. In this embodiment, terminals for testing coupled to the memory chip 3 are omitted as illustrated in FIG. 4. That is, the following terminals of the memory chip 3 and the microcomputer chip 2 are only respectively coupled together: the terminal CKE, terminal CSB, terminal BA[1:0], terminal A[11:0], DQ[31:0], terminal RASB, terminal CASB, terminal WEB, terminal DQS[3:0], DQM[3:0], and CLK and CLKB of the memory chip 3; and the terminals DDRCKE, DDRCS_N, DDRBA[1:0], DDRA[11:0], DDRD [31:0], DDRRAS_N, DDRCAS_N, DDRWE_N, DDRDQS [3:0], DDRRDM[3:0], DDRCK, and DDRCK_N of the microcomputer chip 2.

Figure 7:
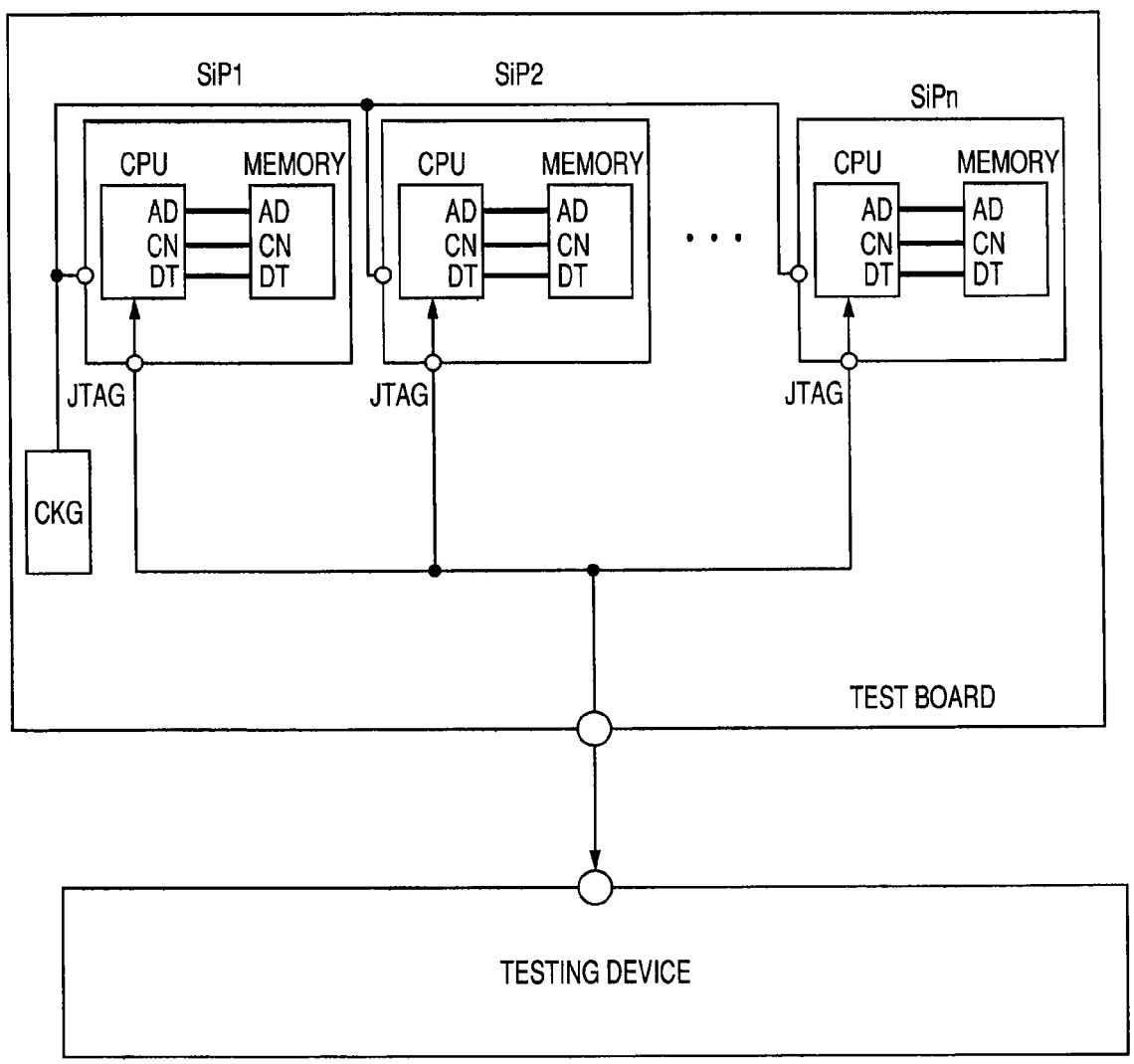
FIG. 7 is a block diagram of an embodiment explaining a screening test for the semiconductor device illustrated in FIG. 6.

FIG. 7 is a block diagram of an embodiment explaining a screening test for the semiconductor device illustrated in FIG. 6. A test board is provided with a clock generation circuit CKG similarly with the foregoing and the clock generation circuit supplies a clock signal corresponding to the actual operation of SiP1 to SiPn as devices under test. On the test board, the devices SiP1 to SiPn under test have their JTAG terminals coupled with a tester in common.

In this embodiment, as mentioned above, a screening test for memory chips 3 is conducted using the above-mentioned JTAG, and terminals for memory test are unnecessary for the memory chip 3 and omitted. The adoption of a method of manufacturing SiPs including a screening test process for memory chips 3 by microcomputer chips 2 using the JTAG brings the following advantage: in a SiP manufactured by this method, for example, a number of external terminals can be reduced by so large an amount as approximately 60. This reduction of the number of external terminals makes it possible to reduce the size of the package of the semiconductor device (SiP) 1. Further, since a wiring running toward a terminal for memory, intersecting a wiring coupling the microcomputer chip 2 and the memory chip 3 together is unnecessary, a number of wiring layers can be accordingly reduced. Therefore, it is possible to use an inexpensive item with a smaller number of wiring layers as the mounting substrate of SiP, and to significantly reduce the parasitic capacitance between the microcomputer chip 2 and the memory chip 3. This reduction in parasitic capacitance makes it unnecessary to increase a current at the output circuits of the microcomputer chip 2 and the memory chip 3 that charge/discharge it, and thus makes it possible to enhance the speed of operation and reduce power consumption.

The above microcomputer chip 2 has such an interface circuit for user debugging as designated as HUDI (High-performance User Debug Interface) like the microcomputer chips of SH series sold by the present applicant. The HUDI makes it possible to read and write data from and to registers including an internal memory by a small number of pins in compliance with the JTAG standard. Using this interface circuit for user debugging, a memory test program for the memory chip 3 is stored in the internal memory of the microcomputer chip 2. When this memory test program is executed by the CPU of the microcomputer chip 2, a screening test on the memory chips is conducted. Needless to add, the interface circuit for user debugging is used to conduct an internal test on the microcomputer chip 2, and this is an intended function of the circuit.

The procedure for writing the memory test program to the internal memory of the microcomputer chip 2 and executing it is as follows: (1) bring the CPU into a "reset hold" state; (2) write data to ASERAM; (3) execute "HUDI boot"; (4) write the memory test program to the internal RAM; (5) confirm that the memory test program has been properly written; (6) start the memory test program; and (7) wait for the completion of the memory test and confirm the test result.

To execute the memory test program, it is required to write the memory test program to the internal memory of the microcomputer chip 2 beforehand. In consideration of the size of the memory test program, the memory test program is written to, for example, the internal RAM (e.g., static random access memory) of the microcomputer chip 2. For example, the above-mentioned SH microcomputer chip is provided with "HUDI write instruction" or "ASERAM write instruction" to write the program to the internal RAM using the HUDI.

The "ASERAM write instruction" is a write instruction dedicated to ASERAM. The "HUDI write instruction" can be used to write the program to the internal RAM; however, this instruction can be used only when the CPU is in operation. To bring the CPU into an operating state, the CPU can be reset and started. If it is reset without any preparation, the program to be executed by the CPU is uncertain and it is unknown how it will operate. The CPU may hang up while the memory test program is being written or the written data may be rewritten. If the CPU is simply reset and started, the following event is expected when data is written according to the "HUDI write instruction" and the written data is checked according to an "HUDI read instruction": it may be impossible to read the written data. To cope with this, this embodiment utilizes "reset hold" and "HUDI boot." The "reset hold" is a state in which the CPU has been reset but a program can be written to the ASERAM, and the "HUDI boot" is a means for executing a program written to the ASERAM. A program is written to the ASERAM according to the "ASERAM write instruction," and the memory test program is written to the internal RAM while it is being executed. It is also possible to check written data by reading it in the "reset hold" state.

Figure 8:
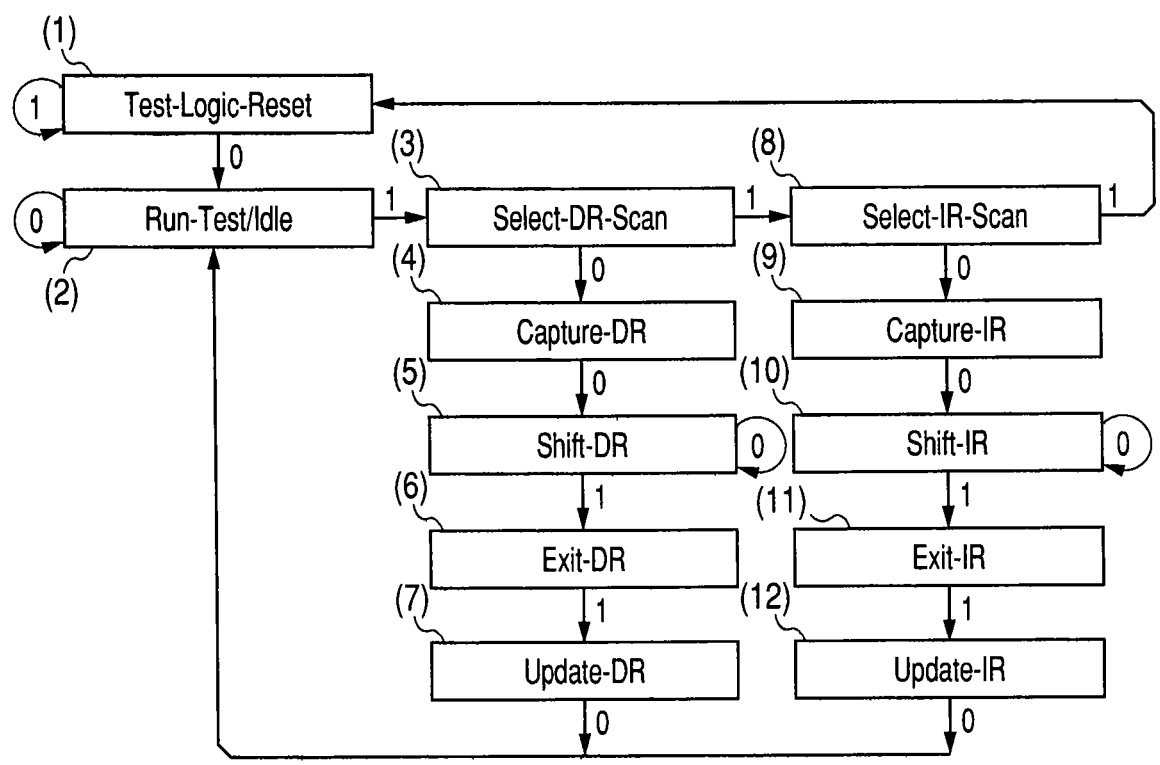
FIG. 8 is a state transition diagram of JTAG TAP used in the invention.

FIG. 8 is a state transition diagram of JTAG TAP (Test Access Port) used in the invention. In this drawing, '0' or '1' beside each arrow indicates that a state transitions when a TMS (test mode) terminal or signal is at '0' or '1.' In general, the description of TAP control transition diagram is abstract and difficult to understand, but all what to do is to write an instruction to an instruction register (hereafter, abbreviated as IR) and read and write a data register (hereafter, abbreviated as DR). Instruction codes as well as written and read data have multiple bits and all what to do is to serially input data from one TDI (Test Data In) terminal in a shift state.

State (1) (Test-Logic-Reset) is HUDI reset and this state (HUDI reset) is established by driving the TMS signal to the high level and generating a TCK (test clock) signal five times. State (2) (Run-Test/Idle) is a via point. The test logic in the IC becomes active only when a specific instruction is present. When a self test is made active by an instruction, for example, the instruction is executed when this state is established. The test logic is kept in an idle state on the other occasions. State (3) (Select-DR-Scan) is reading and writing of DR, it is executed on the lower side (TMS=0) in the drawing and is unexecuted on the right side (TMS=1). State (8) (Select-IR-Scan) is reading and writing of IR, and it is executed on the lower side (TMS=0) in the drawing and is unexecuted on the right side (TMS=1). In this case, the state returns to State (1) above. State (4) (Capture-DR) is capturing of read data. State (9) (Capture-IR) is capturing of read data. State (5) (Shift-DR) is setting of read and write data. State (10) (Shift-IR) is setting of read and write data. State (6) (Exit-DR) is just a via point. State (11) (Exit-IR) is just a via point. State (7) (Update-DR) is writing of set data. State (12) (Update-IR) is writing of set data.

Figure 9:
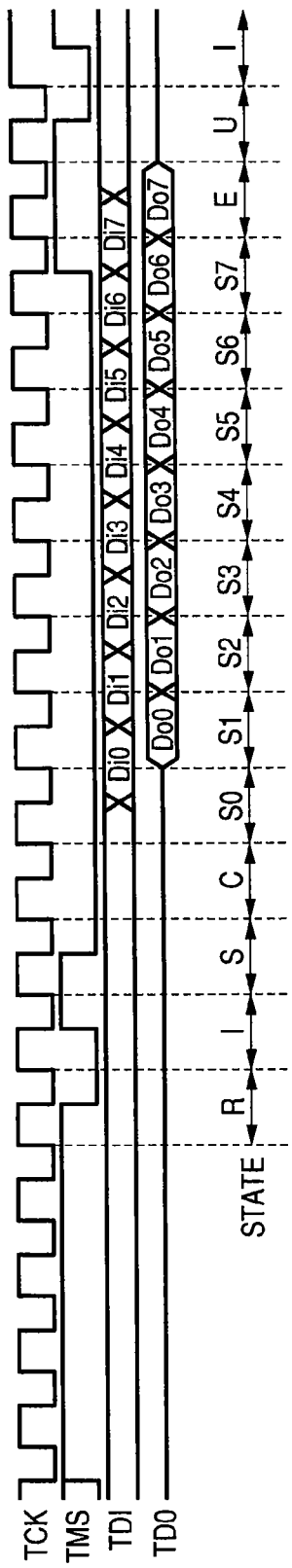
FIG. 9 is a waveform chart of an embodiment of JTAG TAP used in the invention.

FIG. 9 is a waveform chart of an embodiment of the JTAG TAP (Test Access Port) used in the invention. This drawing illustrates an example where a data register is read and written. Reading and writing of a register can be terminated with a required length, and eight bits are read and written in this example. First the TMS signal is driven to the high level ('1') for a time equivalent to five TCK intervals to reset the TAP (State R). Thereafter, the TMS signal is set to '0'-'1'-'0' at rising edges of TCK to cause the state to transition from State (2) (Run-Test/Idle) to State (3) (Select-DR-Scan) to State (4) (Capture-DR). The states are abbreviated as I-S-C. In State (4) (Capture-DR), data is captured, and in the subsequent state, or State (5) (Shift-DR), the captured data is outputted from a TDO (Test Data Out) terminal and further data to be written is set. State (5) (Shift-DR) is comprised of eight cycles of S0 to S7, and data Di0 to data Di7 are serially inputted from the TDI and data Do0 to data Do7 are outputted from the TDO. After the eighth cycle (S7) of State (5) (Shift-DR), the TMS signal is changed to '1'-'1'-'0' to cause the state to transition to State (6) (Exit-DR) to State (7) (Update-DR) to State (2) (Run-Test/Idle). The states are abbreviated as E-U-I. Returning the state to State (2) (Run-Test/Idle) when one time of scan is completed makes the operation easy to understand. The set data is updated in State (7) (Update-DR).

The above-mentioned "reset hold" is a state in which the CPU is in a reset state, nevertheless data can be written to the ASERAM using the "ASERAM write instruction." The method for transition is implemented by driving the terminals or signals /RESET and /TRST to the low level. When there is a pin for switching product chip mode and EVA chip mode, the EVA chip mode is established to use the HUDI function. The reset hold state can be established by keeping the terminals /RESET and /TRST at the low level for a certain period as mentioned above. This reset period requires a certain length of time.

Figure 10:
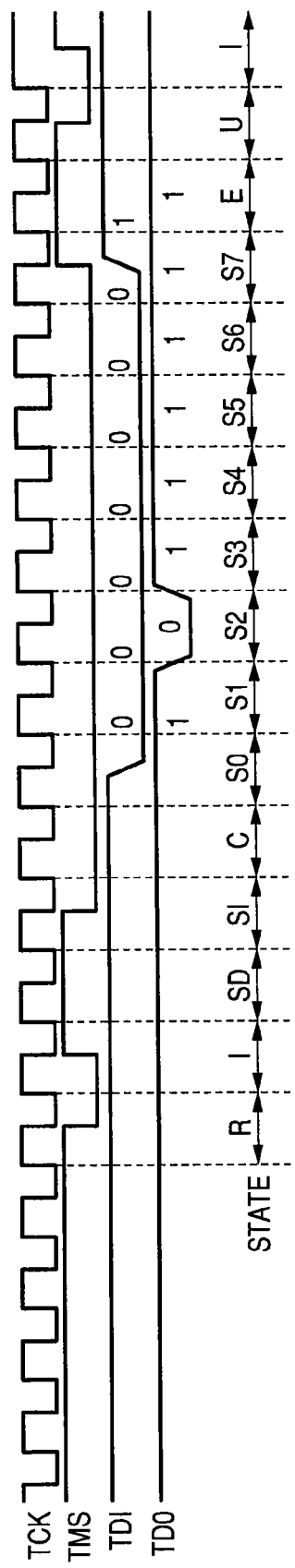
FIG. 10 is a waveform chart explaining HUDI boot.

FIG. 10 is a waveform chart explaining the HUDI boot. All what to do to execute the HUDI boot is to set the "HUDI boot instruction" in the IR in the reset hold state. The IR is a 16-bit register. Since the lower-order bits can be set to any value (don't care), only the eight higher-order bits are set. Similarly with the example in FIG. 9, the state is caused to transition from R (Test-Logic-Reset) to I (Run-Test/Idle) to SD (Select-DR-Scan) to SI (Select-IR-Scan) to C (Capture-IR) and State (10) (Shift-IR) is established. Then a fixed value is constantly outputted from the TDO (Test Data Out) terminal. That the IR path is being implemented can be understood by observing the TDO terminal. When the "HUDI boot instruction" is executed, "ASE break mode" is established and execution is started at the address written at the leading address of the ASERAM. At this time, an ASE break flag is set. Therefore, that the ASE break mode has been established can be confirmed by using the "HUDI read instruction" to refer to the flag.

Figure 11:
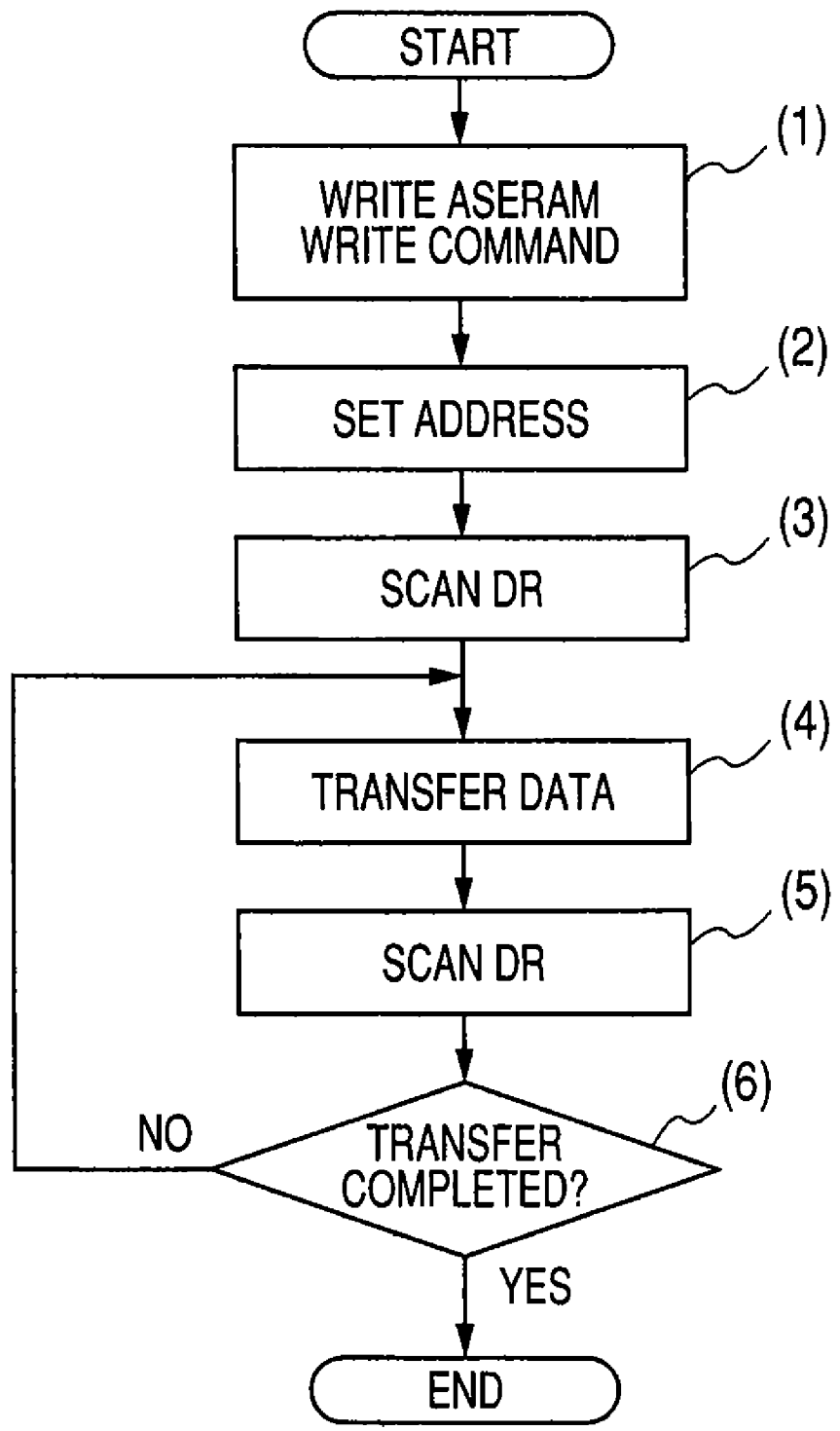
FIG. 11 is a flowchart of an embodiment of ASERAM write mode.

FIG. 11 is a flowchart of an embodiment of the ASERAM write mode. First, at Step (1), the SI (Select-IR-Scan) state is established and a command is written. At Step (2), an address at which data is written is set. The set data is placed at a starting address and an ending address. For example, the starting address is specified by the higher-order 16 bits and the ending address is specified by the lower-order 16 bits. The higher-order 12 bits of addresses are fixed at an area where the ASERAM is disposed. At Steps (3) to (6), the data is set in the DR and then the SD (Select-DR-Scan) is repeated until a transfer flag is set.

Figure 12:
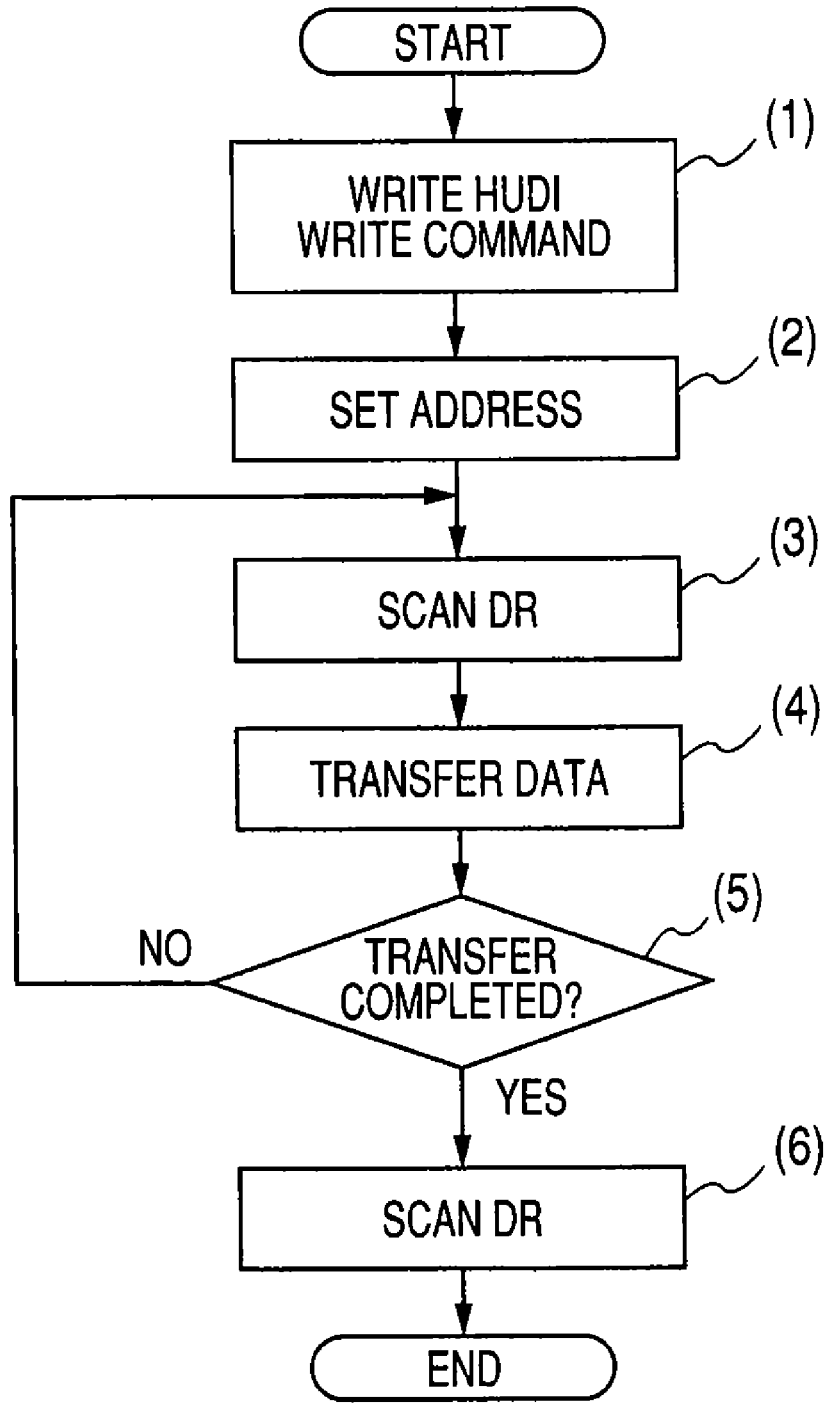
FIG. 12 is a flowchart of an embodiment of HUDI write mode.

FIG. 12 is a flowchart of an embodiment of the HUDI write mode. There are single mode and continuous mode in HUDI write operation, and each mode has 1-, 2-, and 4-byte modes with respect to number of write bytes. The drawing illustrates an example of writing in continuous mode. At Step (1), the SI (Select-IR-Scan) state is established and a command is written. At Step (2), an address at which data is written is set. With respect to the HUDI write operation, at Steps (3) to (6), that a flag is set is confirmed at the first scan and every other scan in the second and following scans. Thus, the number of times of DR-Scan before setting of the flag is confirmed is made different between the first scan and the second and following scans.

Figure 13:
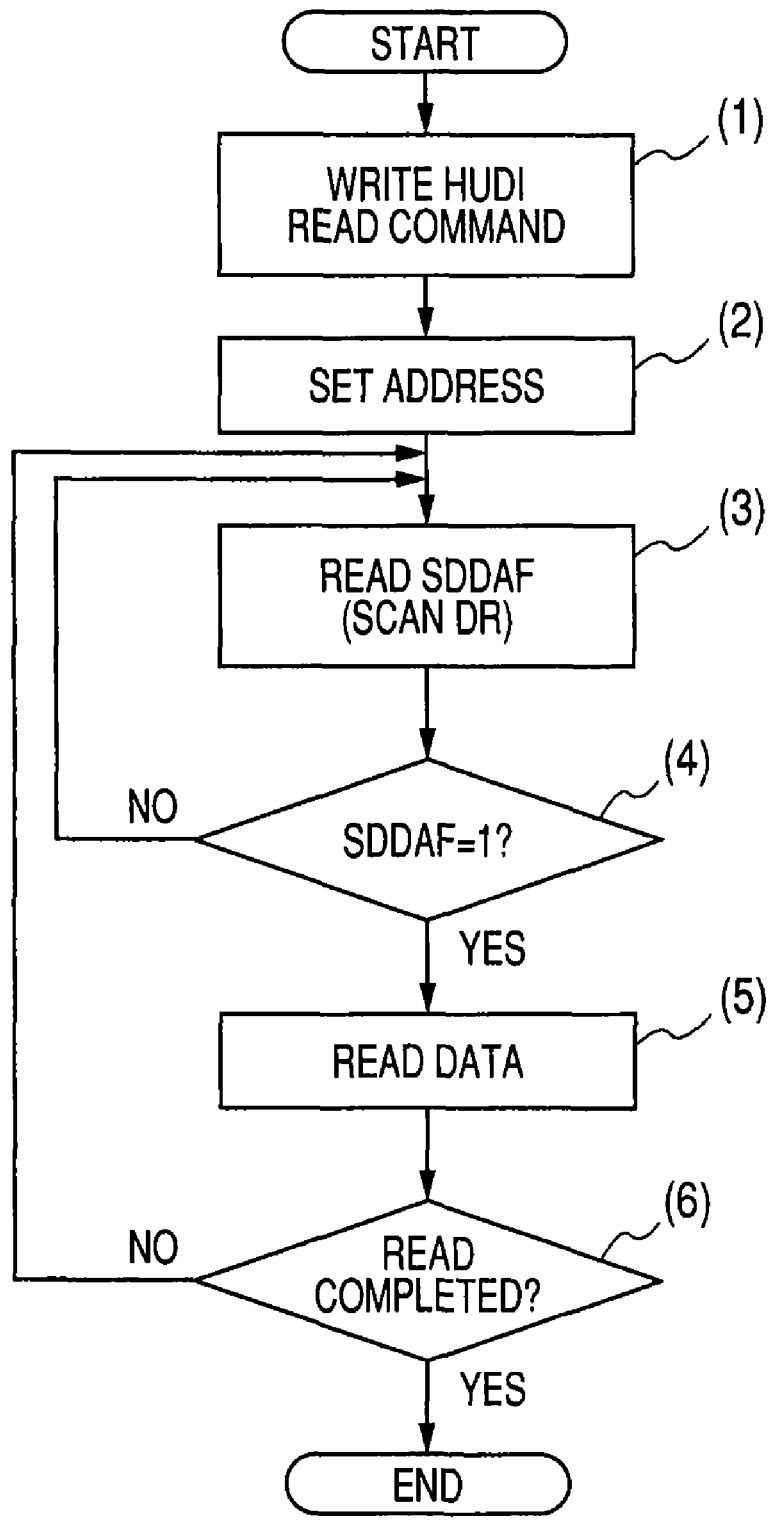
FIG. 13 is a flowchart of an embodiment of HUDI read mode.

FIG. 13 is a flowchart of an embodiment of HUDI read mode. Similarly with the HUDI write, there are single mode and continuous mode and each mode has 1-, 2-, and 4-byte modes with respect to number of write bytes. The drawing illustrates an example of only reading in continuous mode like the example of writing in FIG. 12. At Step (1), the SI (Select-IR-Scan) state is established and a command is written. With respect to reading, a length of several bytes or so is assumed as with respect to the test result; therefore, a read enable flag is confirmed. For this reason, data is read on a DUT-by-DUT basis when the "HUDI read instruction" is used at Steps (3) to (6).

The test operation performed by the above-mentioned ICE module on an external memory chip is as described under Items (1) to (6) below: (1) A CPU chip is brought into the reset hold state as mentioned above. This makes it possible to write data to the RAM (ASERAM) in the ICE module of the CPU chip. A tester controls the above terminals defined in the JTAG standard for this operation and the dedicated terminals of the CPU chip.

(2) A program is written to the above RAM in the ICE module. This program is for supporting transfer of the test program. The tester uses the JTAG pin for this writing operation.

(3) The program written to the RAM in the ICE module is executed. The tester uses the JTAG pin for this writing operation to send a dedicated command to the CPU chip.

(4) The internal RAM is accessed to write the memory test program there. The tester uses the JTAG pin for this writing operation.

(5) The control is branched from the program written to the RAM in the ICE module to the above memory test program. The tester uses the JTAG pin for this writing operation.

(6) The tester monitors the completion of the test, and when the test is completed, it reads the result of determination.

Figure 22:
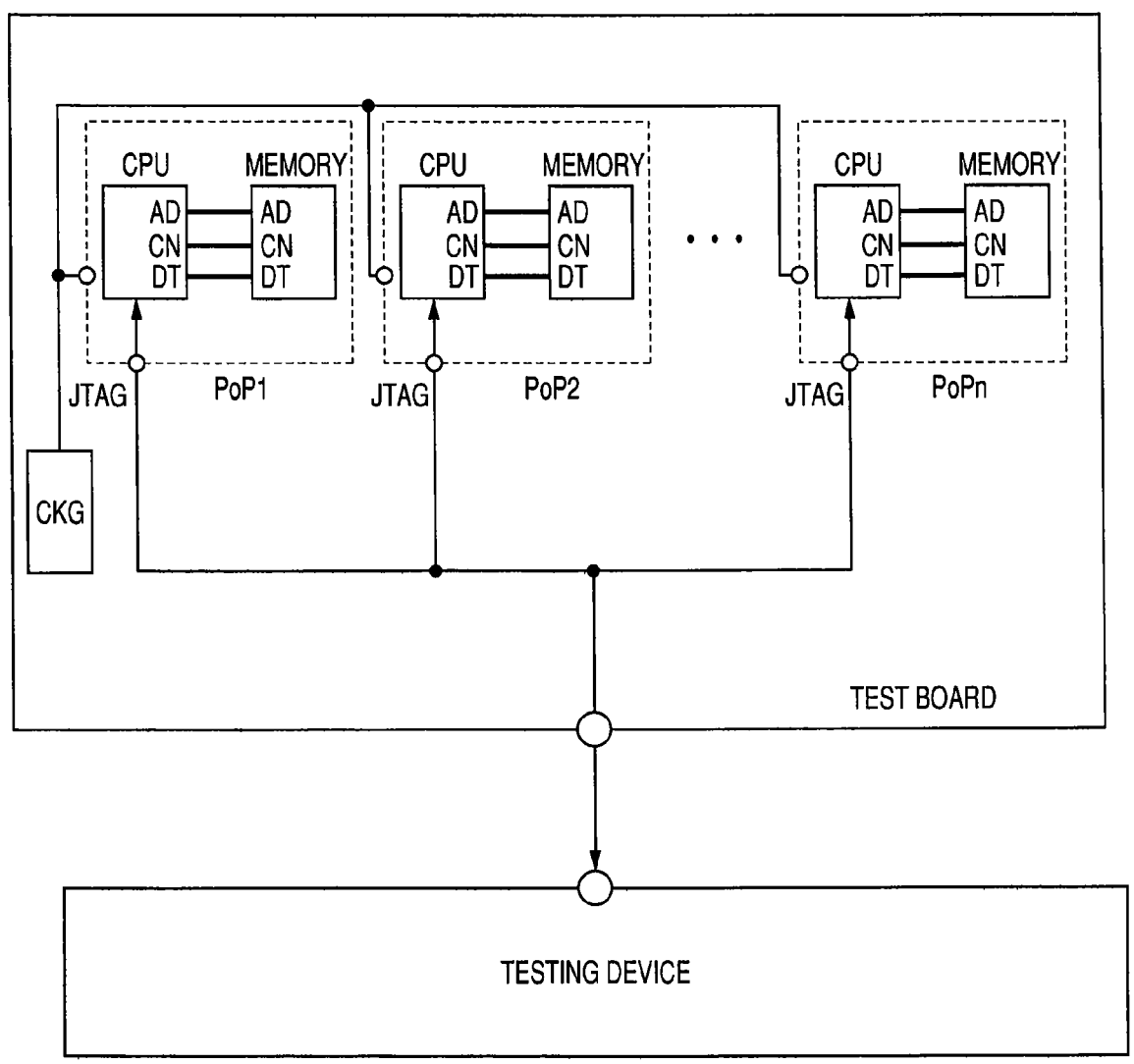
FIG. 22 is a block diagram of an embodiment explaining a performance test for the semiconductor device illustrated in FIG. 21.
Figure 23:
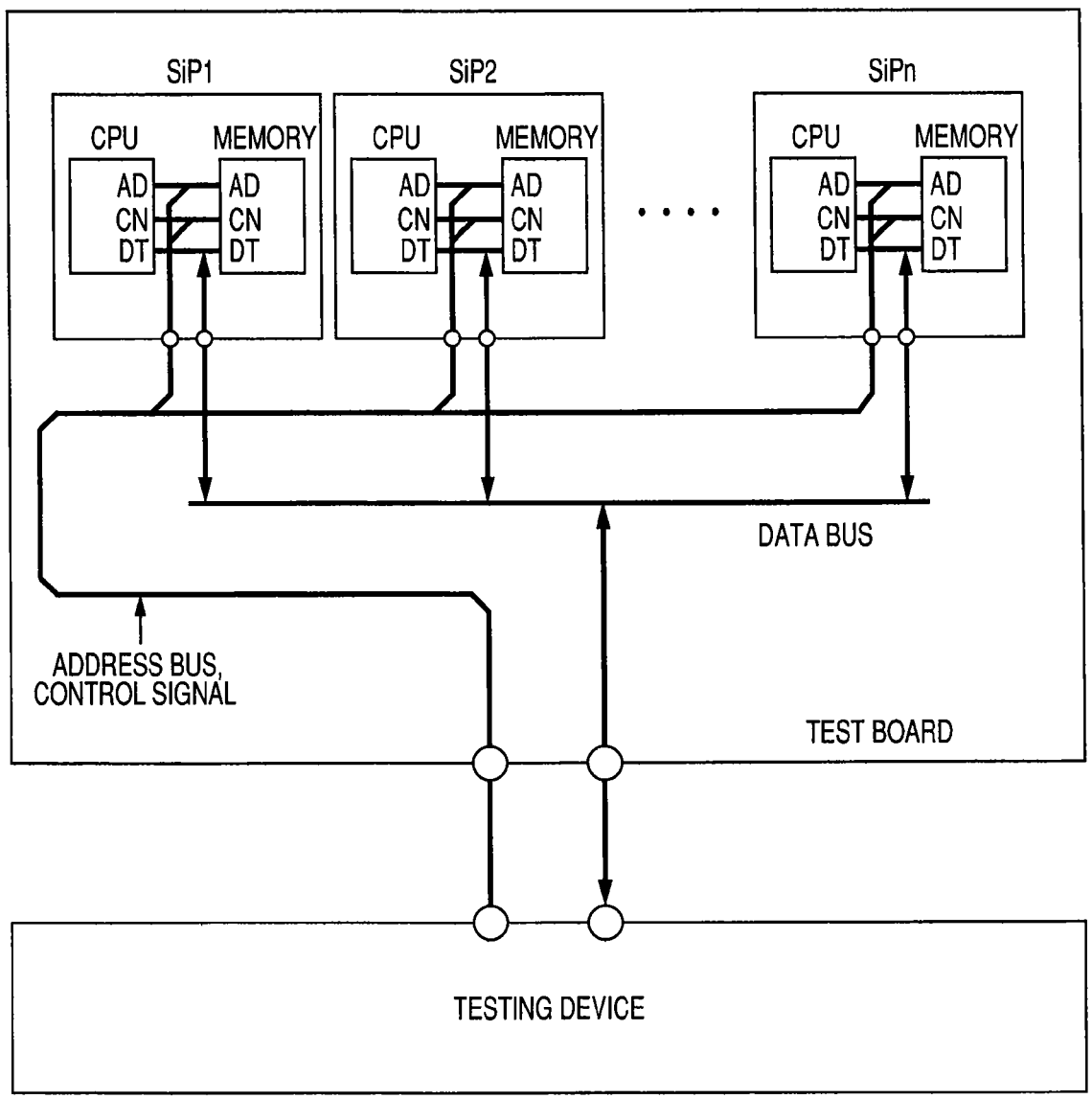
FIG. 23 is a block diagram of a test system considered prior to the invention.
Figure 24:
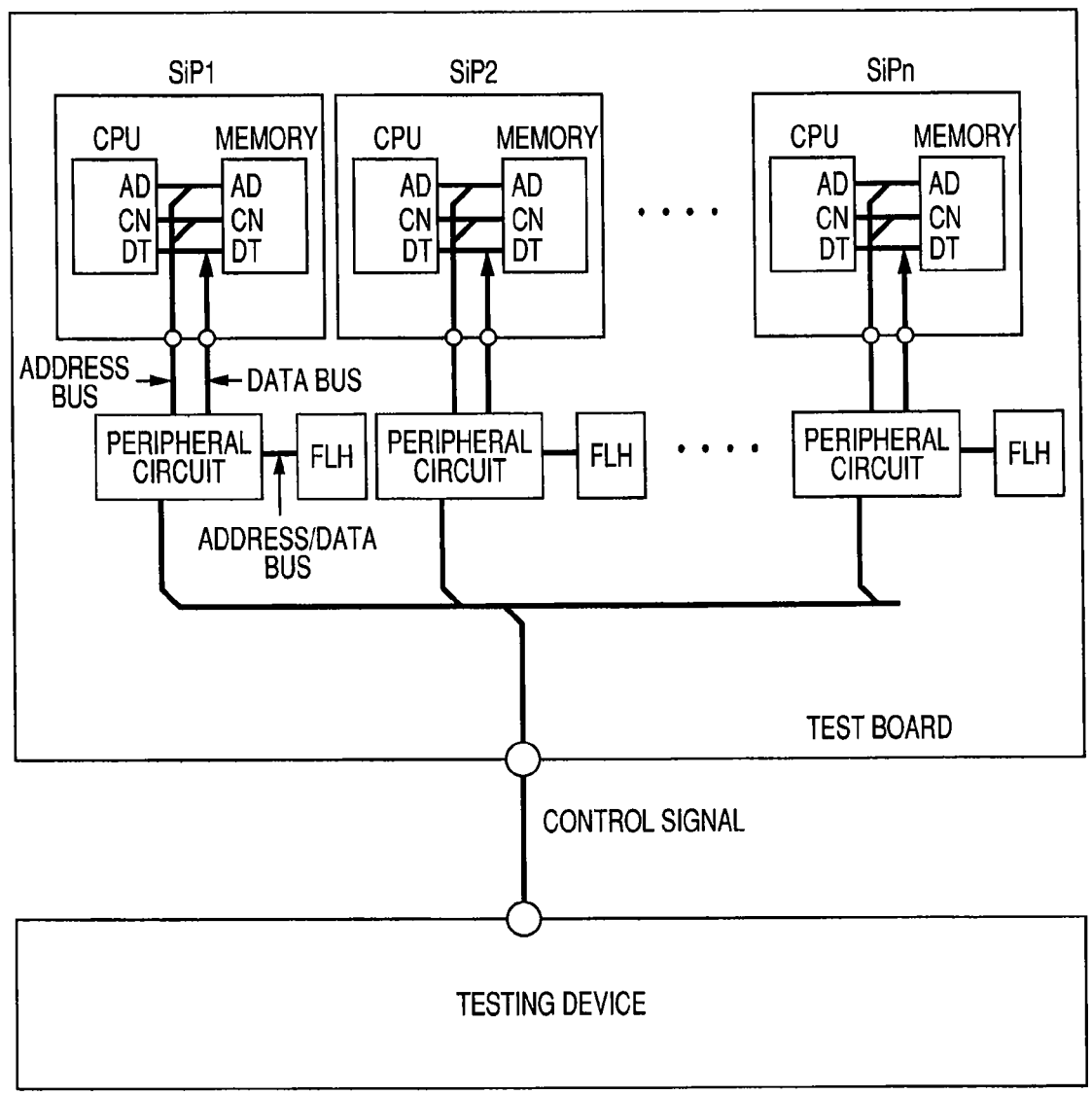
FIG. 24 is a block diagram of a test system for SiPs considered prior to the invention.
Figure 25:
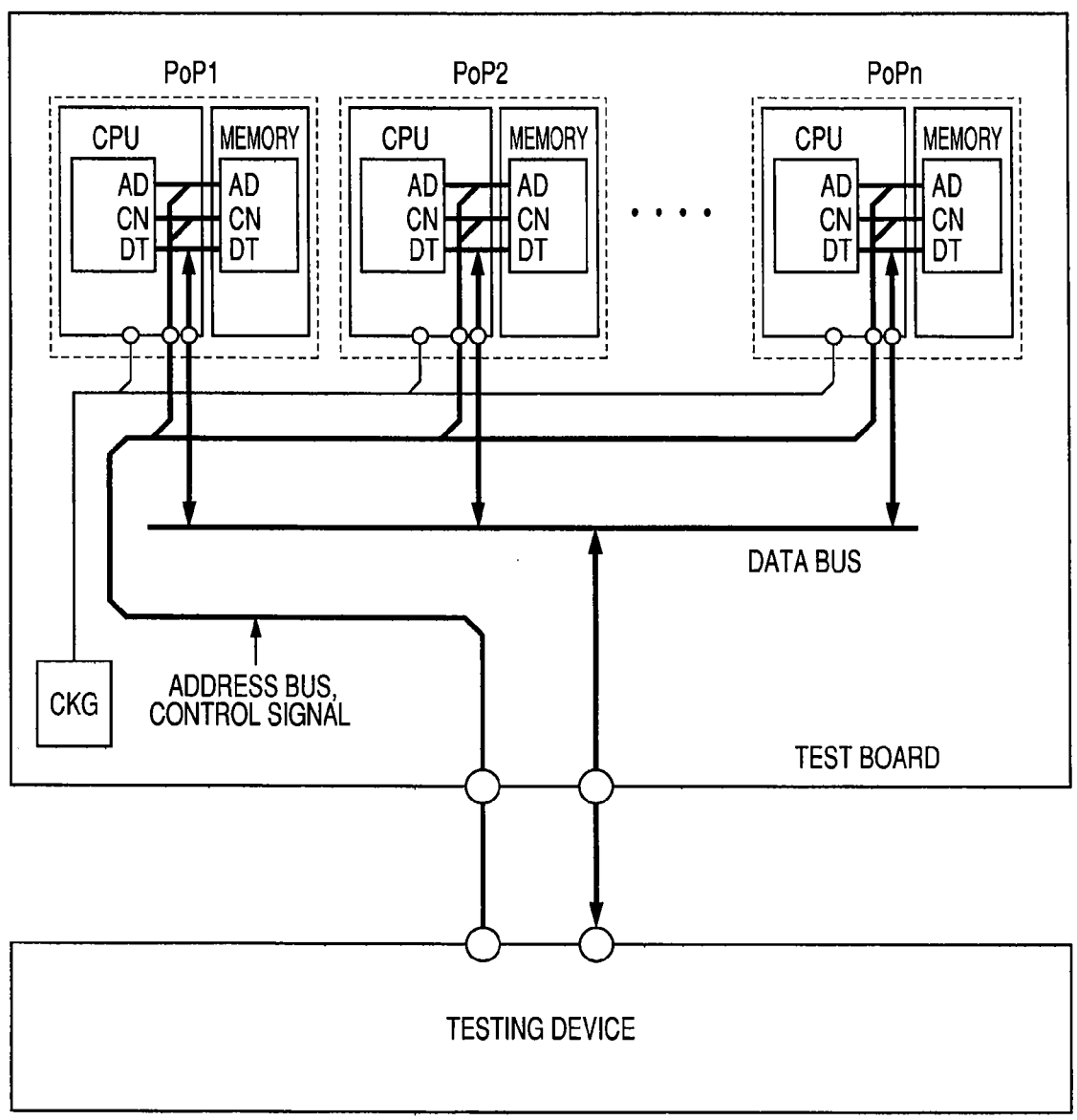
FIG. 25 is a block diagram of a test system for PoPs considered prior to the invention.

The above-mentioned PoP is so constructed that semiconductor chips are mounted over respective mounting substrates and then the obtained semiconductor devices are coupled together. Therefore, prior to the step of coupling the semiconductor devices together, the state of coupling between each semiconductor chip and the corresponding mounting substrate can be determined, and this is effective for coping with reduction in the assembling yield of packages. Further, it is possible to flexibly cope with production of small batches of a variety of systems as compared with SiPs. However, the memory circuit of PoP also involves the following problem similarly with the SiP illustrated in FIG. 5: an expensive high-speed tester is required when the following measure is taken as illustrated in FIG. 22: each device is provided with external terminals for testing coupled to an address terminal AD, a control terminal CN, and a data terminal DT; multiple devices PoP1 to PoPn under test are coupled to an address bus, a control signal, and a data bus provided over a test board; and the memory circuits of the individual devices PoP1 to PoPn under test are directly tested from the tester.

Figure 14:
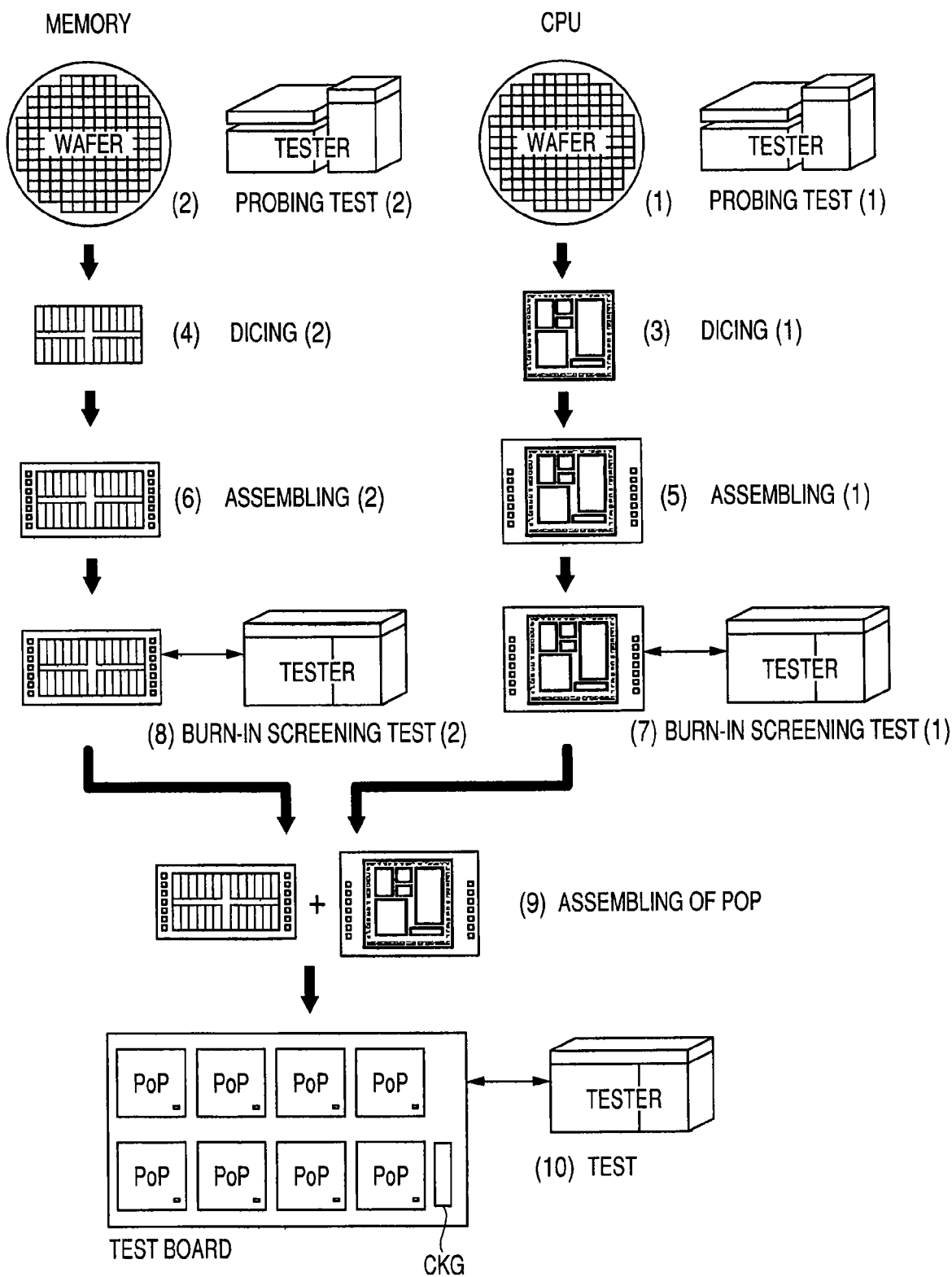
FIG. 14 is a schematic process drawing explaining another embodiment of a method of manufacturing a semiconductor device of the invention.

FIG. 14 is a schematic process drawing explaining another embodiment of a method of manufacturing a semiconductor device of the invention. In Process (1), multiple CPU chips are formed over a semiconductor wafer. When the CPU chips have been formed over the semiconductor wafer as mentioned above, a probing test (1) is conducted by a tester. These CPU chips have a memory circuit described later and an interface circuit for user debugging used in self-diagnosis and the like.

In Process (2), multiple memory chips are formed over a semiconductor wafer similarly with the foregoing. These memory chips have a large storage capacity and perform high-speed operation like DDR-SDRAMs, for example. When the memory chips have been formed over the semiconductor wafer as mentioned above, a probing test (2) is conducted by a tester.

Process (3), the semiconductor wafer with the above CPU chips formed thereover is subjected to dicing (1), and the CPU chips determined as non-defective in the above probing test (1) are sorted.

In Process (4), the semiconductor wafer with the above memory chips formed thereover is subjected to dicing (2), and the memory chips determined as non-defective in the above probing test (1) are sorted.

In Process (5), a CPU chip determined as non-defective in Process (1) is mounted over a mounting substrate. The mounting substrate has a large number of wiring layers and the CPU chip is surface-mounted over its surface (top face). Electrodes for coupling with a semiconductor device mounted with the memory chip are formed outside it.

In Process (6), a memory chip determined as non-defective in Process (2) is mounted over a mounting substrate. The memory chip is mounted face up over the surface of the mounting substrate and is coupled with signal pads over the surface through multiple Au wires. Solder balls corresponding to the electrodes formed over the mounting substrate mounted with the above CPU chip are formed over the back side of the mounting substrate.

In Process (7), a screening test (1) is conducted on the semiconductor device mounted with the CPU chip assembled in Process (5). In this screening test (1), burn-in is simultaneously conducted as required.

In Process (8), a screening test (2) is conducted on the semiconductor device mounted with the memory chip assembled in Process (6). In this screening test (2), burn-in is simultaneously conducted as required.

In Process (9), the semiconductor device mounted with the memory chip determined as non-defective in Process (8) is stacked over the semiconductor device mounted with the CPU chip determined as non-defective in Process (7). Thus, they are assembled as a stacked package of two-layered structure in which the corresponding terminals of the CPU chip and the memory chip are coupled together through the above solder balls.

In Process (10), a test is conducted on these assembled PoPs. The test board used in this test is mounted with a clock generation circuit CKG, which supplies a high-speed clock signal corresponding to actual operation to the semiconductor devices (PoP) as devices under test attached to sockets for testing. A tester accesses the CPU chips of the multiple devices PoP under test mounted over the test board through the above-mentioned interface circuits for user debugging. Then it writes a test program for the memory chips to the memory circuits embedded therein. Thereafter, the tester starts the CPU chips and accesses the memory chips according to the program stored in the above embedded memory. Thus the results of failure/no-failure determination are obtained and transferred to the tester. The CPU chips themselves are also tested as follows: an ICE (In-Circuit Emulator) module is accessed through the interface circuit for user debugging and a peripheral circuit including CPU and the above embedded memory circuit is tested.

Processes (1) to (10) above may be all conducted by one semiconductor maker or may be conducted as follows, though not specially limited: Processes (1), (3), (5), (7) are conducted by a first semiconductor maker who forms CPU chips; and Processes (2), (4), (6), (8) are conducted by a second semiconductor maker, different from the first semiconductor maker, who forms memory chips. Processes (1), (3), (5), and (7) for manufacturing semiconductor devices mounted with the above CPU chip and Processes (2), (4), (6), and (8) for manufacturing semiconductor devices mounted with the above memory chip may be appropriately conducted by multiple manufacturers in a shared manner. Process (9) may be carried out by a set maker who forms cellular phone units or the like. In this case, the test in Process (10) is conducted by the set maker who carries out Process (9).

The test in Process (10) in this embodiment is conducted by conducting a memory test as follows: a semiconductor device mounted with the CPU chip repeats writing/reading data to/from a memory cell of a semiconductor device mounted with the memory chip in correspondence with the above clock signal in exactly the same state as the above PoP actually operates. The program for this test is simultaneously inputted from the tester to the multiple PoPs mounted over the test board, as mentioned above. In addition, in the PoPs mounted over the test board, their memory chips are concurrently tested according to the respectively inputted program. Therefore, even when the memory circuits have a large storage capacity as mentioned above, the tests can be completed in a short time and all together.

The semiconductor devices mounted with the CPU chip and the semiconductor devices mounted with the memory chip themselves are subjected to the screening tests (1) and (2) including burn-in. These tests are conducted on devices in a single state and are not conducted on devices assembled as the above-mentioned PoP. In a semiconductor device of the PoP structure, two semiconductor devices are stacked in layers with a small gap in-between. Consequently, it is predicted that they will be strongly influenced by heat from each other. Therefore, the following is indispensable to ensure the performance of both the CPU and the memory of a semiconductor device of the PoP structure: conducting a memory test on the devices assembled as a semiconductor device of the PoP structure according to a clock corresponding to actual operation.

Figure 15:
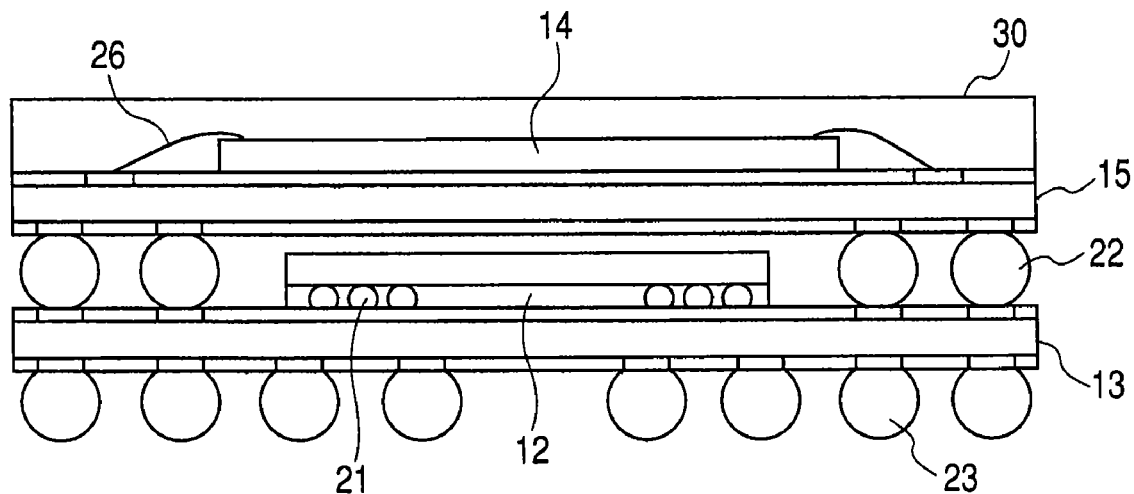
FIG. 15 is a schematic sectional view of an embodiment of a semiconductor device of the PoP structure to which the invention is applied.

FIG. 15 is a schematic sectional view of an embodiment of a semiconductor device of the PoP structure to which the invention is applied. A first mounting substrate 13 mounted with a CPU chip 12 and a second mounting substrate 15 mounted with a memory chip 14 are electrically coupled together. This coupling is carried out by coupling the multiple solder balls 22 formed on the back side of the second mounting substrate 15 to the corresponding electrodes of the first mounting substrate 13. The first mounting substrate 13 has the CPU chip 12 mounted in the center of its surface. Therefore, these solder balls 22 are disposed along the peripheral portion of the back side of the second mounting substrate 15. At the peripheral portion of the surface of the first mounting substrate 13 (outside the CPU chip 12), electrode pads to which the solder balls 22 are to be coupled are formed. The memory chip 14 is DDR-SDRAM, though not specially limited, and is coupled with bonding pads of the second mounting substrate 15 through Au wires (bonding wires) 26. These bonding pads and the electrode pads on the back side of the second mounting substrate 15 are electrically coupled together through signal wirings on the substrate surface and via holes for coupling them. The memory chip 14, Au wires 26, and electrode pads are hermetically sealed with molding resin 30.

The CPU chip 12 is flip-chip coupled (face-down joined) to electrode pads over the surface of the mounting substrate 13 through multiple solder balls 21 formed over its principal surface (under surface). The principal surface of the CPU chip 12 is hermetically sealed with underfill resin. On the back side of the first mounting substrate 13, multiple electrode pads for external input/output signals arranged in a grid pattern are formed, and solder balls 23 are coupled to these electrode pads. The pads for signals over the surface of the first mounting substrate 13 and the pads for external input/output signals on the back side are electrically coupled together through signal wirings on the substrate surface, signal wirings in internal layers, and via holes for coupling them.

Figure 16:
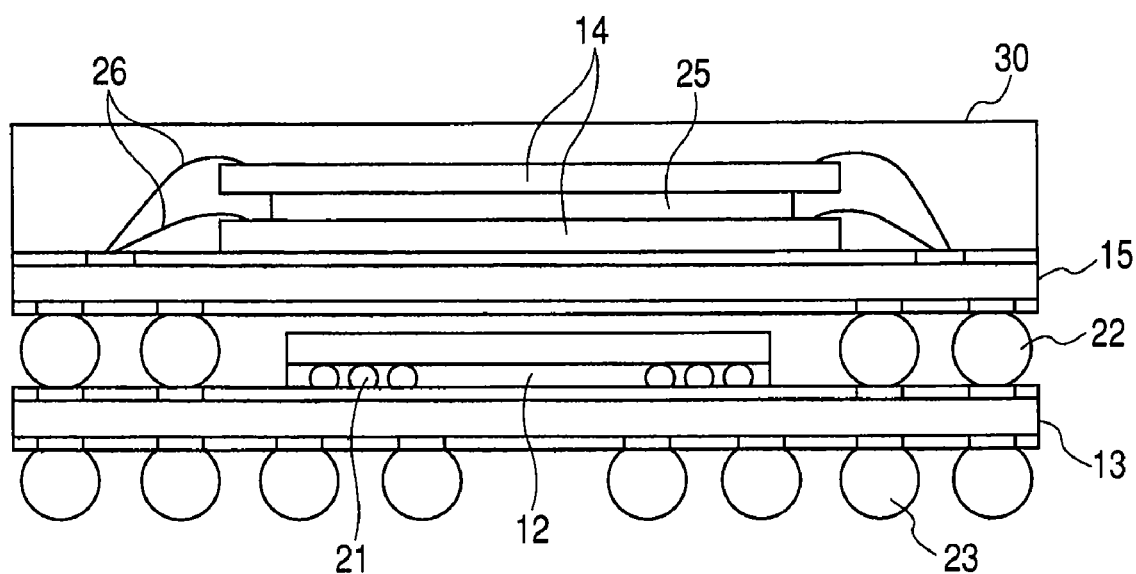
FIG. 16 is a schematic sectional view of another embodiment of a semiconductor device of the PoP structure to which the invention is applied.

FIG. 16 is a schematic sectional view of another embodiment of a semiconductor device of the PoP structure to which the invention is applied. In this embodiment, the upper semiconductor device is mounted with two memory chips 14. That is, this embodiment is intended to achieve a storage capacity twice that of the device in FIG. 15 by mounting two DDR-SDRAMs having the same storage capacity. The two memory chips 14 are stacked together with a dummy chip 25 as a spacer in-between. This dummy chip 25 ensures a space for Au wires 26 for the lower memory chip 14. The other aspects of this configuration are the same as in the device in FIG. 15.

Figure 17:
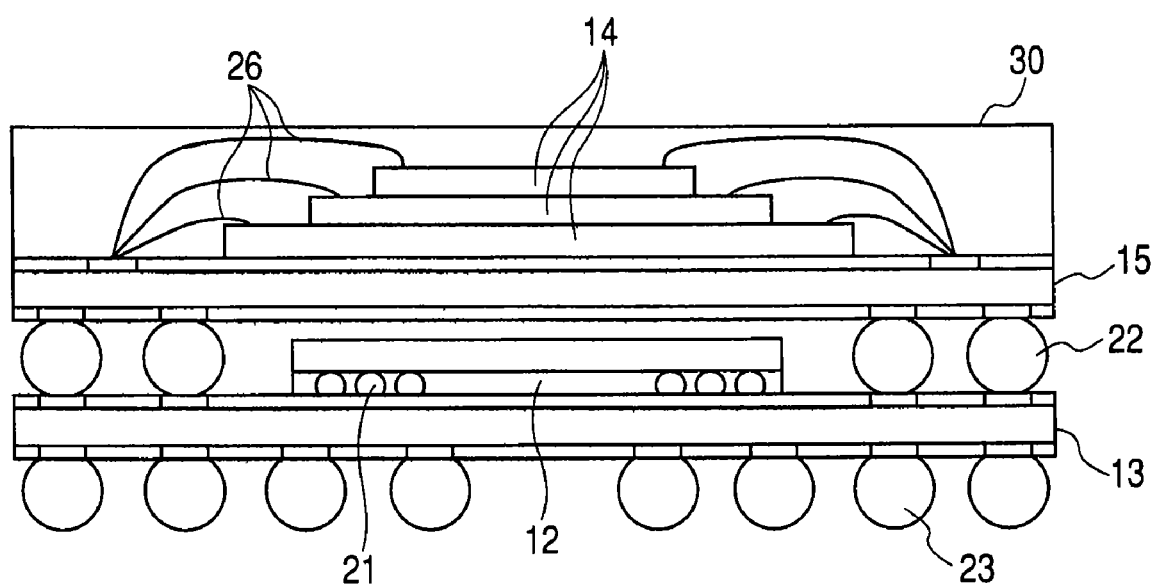
FIG. 17 is a schematic sectional view of another embodiment of a semiconductor device of the PoP structure to which the invention is applied.

FIG. 17 is a schematic sectional view of another embodiment of a semiconductor device of the PoP structure to which the invention is applied. In this embodiment, the upper semiconductor device is mounted with three different kinds of memory chips 14 in a stacked configuration. The three different kinds of memory chips are comprised of, for example, DDR-SDRAM, SDRAM, and a collectively erasable non-volatile memory (flash memory). In this case, a memory chip larger in size is positioned on the lower side to ensure a space for bonding pads provided in the memory chips and Au wires. When the memory chips are substantially identical in size, the three different kinds of memory chips can be assembled in laminated structure with dummy chips placed in-between as illustrated in FIG. 16. In this case, the lower CPU chip 12 is provided with an interface circuit that can be directly coupled with the three different kinds of memory chips. The other aspects of this configuration are the same as in the devices in FIG. 15 and FIG. 16.

Figure 18:
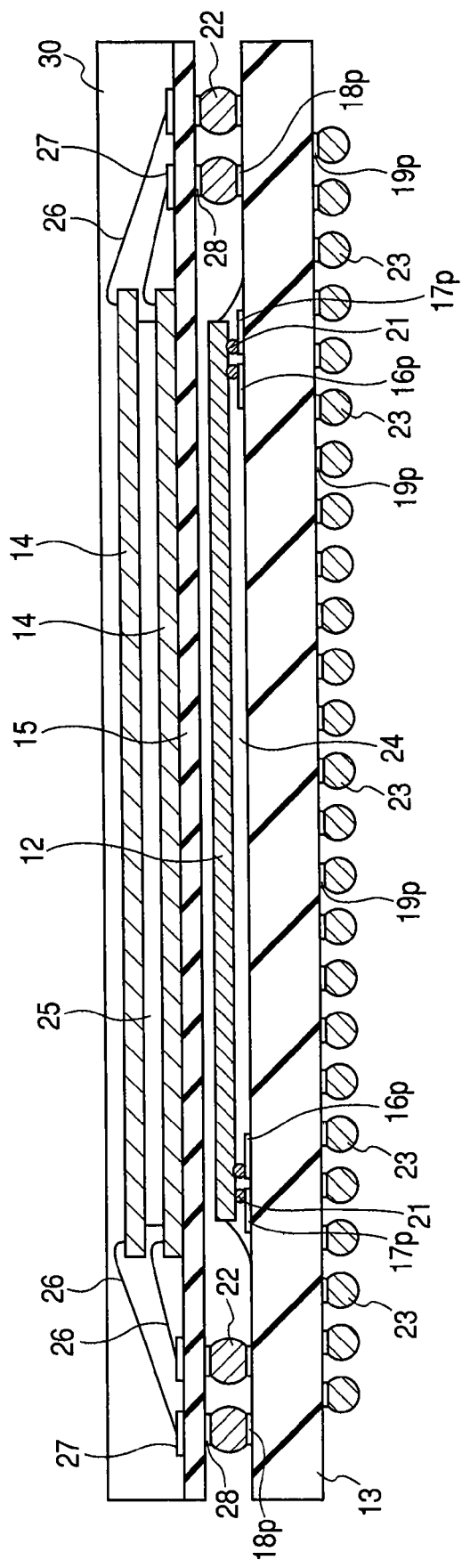
FIG. 18 is a sectional view of an embodiment of a semiconductor device corresponding to FIG. 16.

FIG. 18 is a sectional view of an embodiment of a semiconductor device corresponding to FIG. 16. The semiconductor device of the PoP structure in this embodiment is a stacked package of the two-layer structure constructed as follows: a mounting substrate (second wiring substrate) 15 mounted with memory chips 14 is stacked on the top of a mounting substrate (first wiring substrate) 13 mounted with a CPU chip 12. The CPU chip 12 has such an interface circuit for user debugging as designated as HUDI (High-performance User Debug Interface) like the microcomputer chips of SH series sold by the present applicant.

The HUDI makes it possible to read and write data from and to registers including an internal memory by a small number of pins in compliance with the JTAG standard. Using this interface circuit for user debugging, a memory test program for the memory chips 14 is stored in the internal memory of the CPU chip 12. When this memory test program is executed by the CPU of the CPU chip 12, a test on the memory chips 14 is conducted. Needless to add, the interface circuit for user debugging is used to conduct an internal test on the CPU chip 12, and this is an intended function of the circuit. The CPU chip 12 is provided with a memory interface circuit (DDR-SDRAM, SDRAM, collectively erasable non-volatile memory) corresponding to the memory chips 14 in addition to an embedded memory such as a static RAM and a peripheral circuit. It is directly coupled to the corresponding memory chips 14 through the memory interface circuit.

The semiconductor device in this embodiment is provided with a storage capacity of approximately one gigabit by stacking two DDR-SDRAM chips 14 of approximately 512 megabits over the surface (top face) of the mounting substrate 15 with a dummy chip 25 in-between. The storage capacity or number of memory chips 14 mounted over the mounting substrate 15 can be changed as appropriate. That is, a variety of semiconductor devices of the PoP structure can be manufactured substantially without changing the specifications of the mounting substrate 13 as a base over mounted with the CPU chip 12 by taking the following measure: the storage capacity or number of memory chips 14 mounted over the memory mounting substrate 15 is changed.

The mounting substrate 13 is a multilayer wiring substrate having six layers of wiring (surface wiring, back wiring, and four layers of internal wiring) manufactured by, for example, a build-up process. An insulating layer for electrically insulating wiring layers from each other is formed of prepreg obtained by impregnating glass fiber or carbon fiber with resin. The six layers of wiring are comprised of, for example, a conductive film based on copper (Cu). In FIG. 18, these wirings are omitted, and only electrode pads 16p, 17p, 18p formed over the surface (top face) of the mounting substrate 13 and electrode pads 19p for external input/output formed over the back side of the mounting substrate 13 are depicted.

The CPU chip 12 is flip-chip coupled (face-down joined) to electrode pads 16p, 17p over the surface of the base substrate 13 through multiple solder balls 21 formed over its principal surface (under surface). The principal surface of the CPU chip 12 is hermetically sealed with underfill resin 24. The CPU chip 12 has a very large number of input/output terminals, though not shown in the drawing. Therefore, the bonding pads (and the solder balls 21 coupled to their surfaces) are disposed in two rows along the four sides of the principal surface of the CPU chip 12, and the bonding pads in the inner row and the bonding pads in the outer row are disposed in a staggered arrangement.

On the back side of the mounting substrate 13, multiple electrode pads 19p for external input/output are formed. Solder balls 23 are electrically coupled to their surfaces. The semiconductor device of the PoP structure is mounted over the mother board of an information communication terminal device through these solder balls 23. The wirings over the surface of the mounting substrate 13 and the electrode pads 19p for external input/output over the back side are electrically coupled together through internal wirings and via holes for coupling them.

The memory mounting substrate 15 mounted with the two memory chips 14 is comprised of a resin substrate using glass epoxy resin or the like for an insulating layer. One of the two memory chips 14 is face-up mounted over the surface of the memory substrate 15 and the other is stacked over this memory chip 14 with the dummy chip 25 in-between. Each of the two memory chips 14 is electrically coupled to electrode pads 27 over the surface of the memory mounting substrate 15 through Au wires 26. The two memory chips 14, dummy chip 25, Au wires 26, and electrode pads 27 are hermetically sealed with molding resin 30. On the back side of the memory mounting substrate 15, electrode pads 28 are formed and these electrode pads are electrically coupled to the above electrode pads 27 through via holes, not shown. Solder balls 22 are electrically coupled to the surfaces of the electrode pads 28. Each set of the electrode pads 27, 28 is disposed in two rows, for example, along opposite sides of the peripheral portion of the memory mounting substrate 15.

The solder balls 22 coupled to the electrode pads 28 of the memory mounting substrate 15 are also electrically coupled to the electrode pads 18p formed in the peripheral portion of the surface of the mounting substrate 13. Thus, the mounting substrate 13 mounted with the CPU chip 12 and the memory mounting substrate 15 mounted with the memory chips 14 are electrically coupled together. The solder balls 22 have a diameter larger than the thickness obtained by adding the diameter of the solder balls 21 formed over the principal surface of the CPU chip 12 and the thickness of the CPU chip 12. This prevents the top face of the CPU chip 12 mounted over the mounting substrate 13 and the under surface of the memory mounting substrate 15 from being brought into contact with each other. As mentioned above, on the back side of the mounting substrate 13, the electrode pads 19p for external input/output are formed. The solder balls 23 are coupled to the electrode pads 19p for external input/output.

Figure 19:
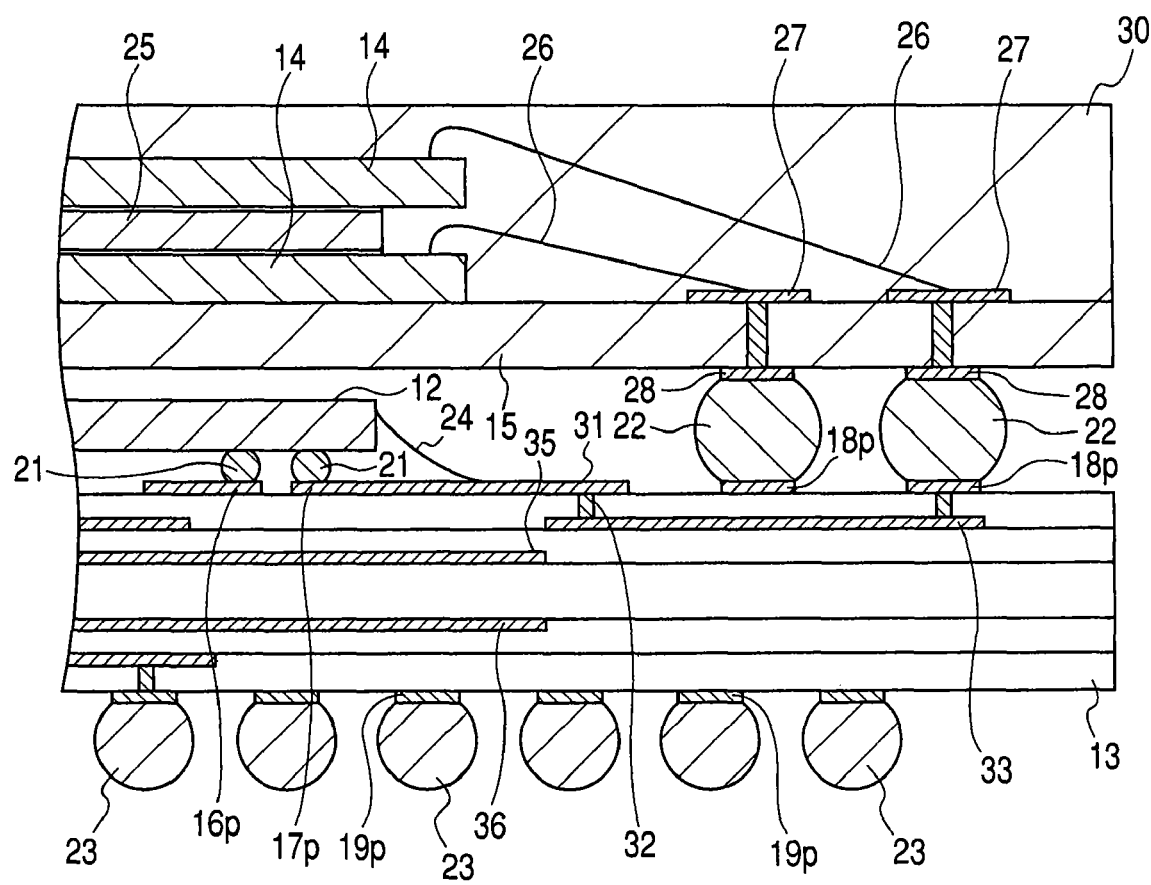
FIG. 19 is a partially enlarged sectional view of an embodiment of the semiconductor device illustrated in FIG. 18.

FIG. 19 is a partially enlarged sectional view of an embodiment of the semiconductor device illustrated in FIG. 18. In the example illustrated in FIG. 19, the corresponding signal terminals of the CPU chip 12 and the memory chips 14 are electrically coupled together through the following: a surface wiring 31 formed integrally with an electrode pad 17p in the outer row, a via hole 32, and a second-layer wiring 33. Because of wiring design rules, it may be impossible at some point to electrically couple the CPU chip 12 and a memory chip 14 together through an electrode pad 17p in the outer row. In this case, the CPU chip 12 and the memory chip 14 are electrically coupled together through an electrode pad 16p in the inner row. For example, the CPU chip 12 and the memory chips 14 can be electrically coupled together through the following: the electrode pads 16p in the inner row and the second-layer wiring extended inward beyond the via hole 32 and the electrode pads 17p in the outer row.

The mounting substrate 13 is not provided with an electrode pad for testing for enabling direct access to the memory chips 14, though not specially limited. This makes unnecessary an electrode pad for testing and wiring for coupling it between the CPU chip 12 and the memory chips 14. This brings about the following advantages: the size of the mounting substrate 13 can be reduced by an amount equivalent to the area required for forming the electrode pad for testing and the wiring for coupling it; it is possible to reduce parasitic capacitance in signal transfer between the CPU chip 12 and the memory chips 14 and reduce noise arising from the reflection or coupling of a signal or the like; and thus it is possible to achieve signal transfer suitable for high-speed memories such as DDR-SDRAMs. Further, since an amount of wiring layers formed in the mounting substrate 13 is reduced, it is possible to suppress warp in the mounting substrate 13 due to the difference in coefficient of thermal expansion between a wiring layer and an insulating layer (prepreg).

Figure 20:
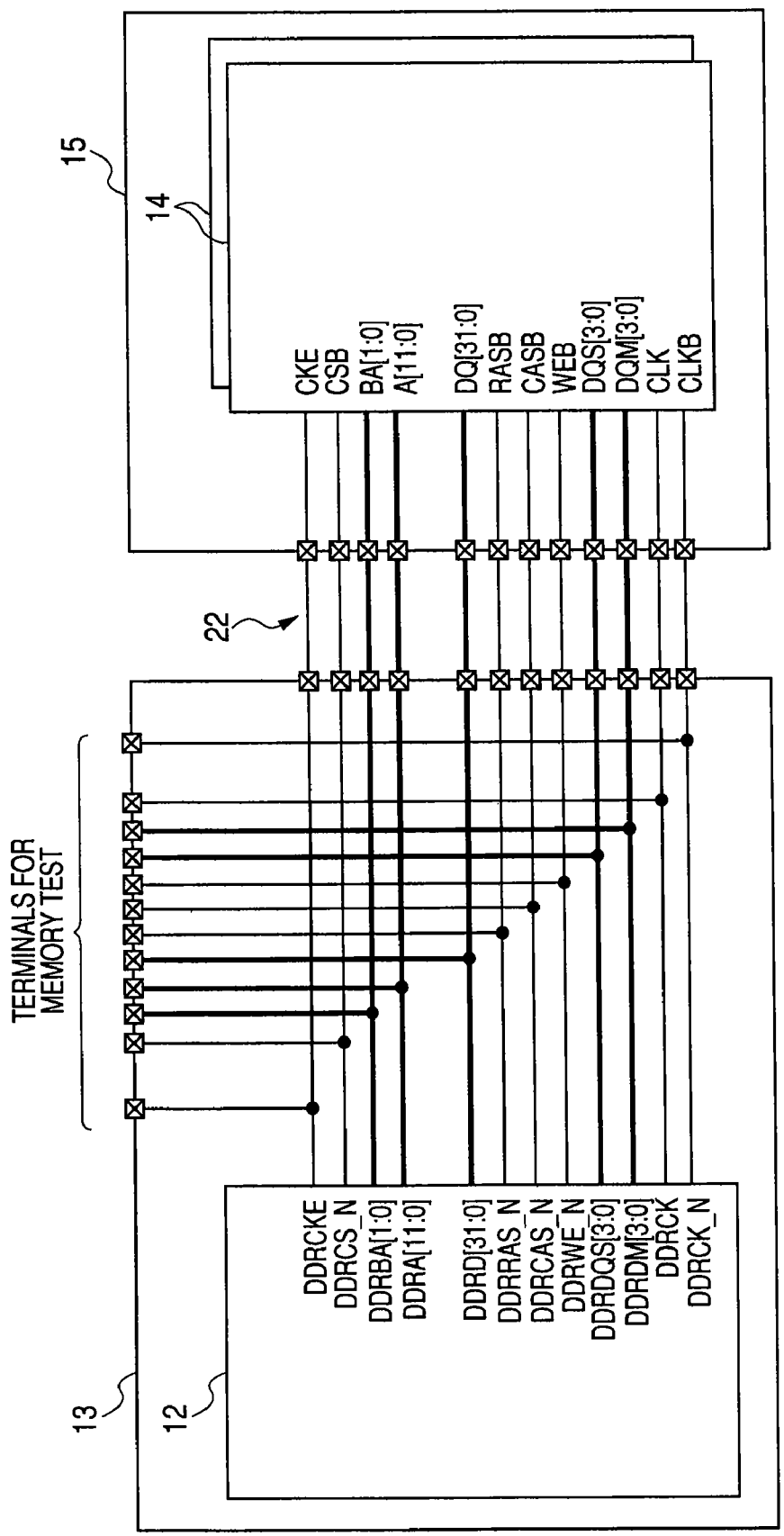
FIG. 20 is an internal block diagram of an embodiment of PoP of the invention.

FIG. 20 is an internal block diagram of an embodiment of PoP of the invention. The PoP in this embodiment corresponds to the semiconductor device in FIG. 16. This drawing is depicted with a focus on the relation of coupling between the CPU chip 12 and the memory chips 14. The memory chips 14 are DDR-SDRAMs. A terminal CKE is a clock enable input. A terminal CSB is a chip select input. A terminal BA[1:0] is a bank address input. A terminal A[11:0] is an address input. A terminal DQ[31:0] is a data input/output. A terminal RASB is a row address strobe input. A terminal CASB is a column address strobe input. A terminal WEB is a write enable input. A terminal DQS[3:0] is a data strobe input/output. A DQM[3:0] is a DQ write mask enable input. Terminals CLK and CLKB are clock inputs.

The semiconductor device in this drawing is provided with a storage capacity of approximately one gigabit as a whole by providing two DDR-SDRAMs of approximately 512 Mbits, though not specially limited. The two DDR-SDRAMs have their terminals DQ[31:0] respectively coupled to the corresponding 64-bit data input/output terminal of the CPU chip 12, and thus data can be written/read to/from them in 64-bit blocks. Or, the terminals DQ[31:0] are coupled in parallel to the 32-bit data input/output terminal of the CPU chip 12. In this case, the chip select terminals CSB of the two DDR-SDRAMs are supplied with a select signal from the CPU chip 12 to select either DDR-SDRAM. Or, an expanded address signal may be supplied to address terminals to select either of the two DDR-SDRAMs.

The CPU chip 12 has the following terminals respectively directly coupled to the input terminals and input/output terminals of the DDR-SDRAMs: output terminals DDRCKE, DDRCS_N, DDRBA[1:0], DDRA[11:0], DDRRAS_N, DDRCAS_N, DDRWE_N, DDRRDM[3:0], DDRCK, and DDRCK_N; and input/output terminals DDRD[31:0] and DDRDQS[3:0]. In this drawing, the terminal names suffixed with B, such as CSB, of the memory chips 14 indicate that they are for active-low bar signals. In correspondence therewith, the terminal names suffixed with _N, such as DDRCS_N, of the CPU chip 12 indicate that they are for active-low negative signals.

In this embodiment, the semiconductor device such as PoP is provided with terminals for testing in signal paths connecting the CPU chip 12 and the memory chips 14. Use of these terminals for testing makes it possible to directly access the memory chips 14, for example. The CPU chip 12 is provided with a terminal JTAG coupled to the interface circuit for user debugging of the CPU chip 12. The above terminals for testing are convenient for conducting a direct-current test to check the coupling between memory chips 14 and a CPU chip 12 through solder balls 22. However, the following advantages are brought about by conducting a memory test on the devices assembled as a semiconductor device of the PoP structure as mentioned above according to a clock corresponding to actual operation using the terminal JTAG: it is possible to ensure the performance of both the CPU and the memories of the semiconductor device of the PoP structure and obviate necessity for an expensive tester.

Figure 21:
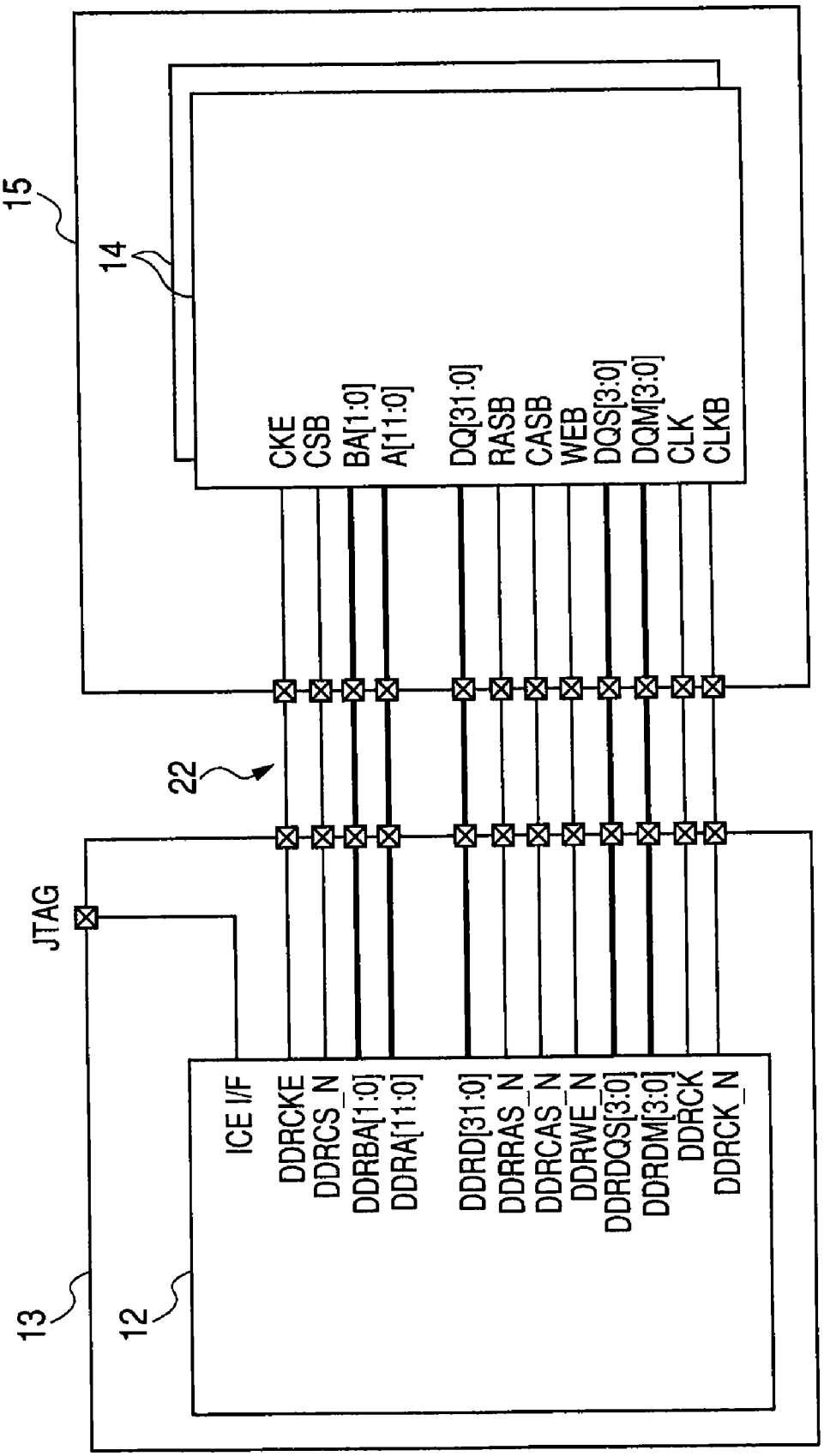
FIG. 21 is an internal block diagram of another embodiment of PoP of the invention.

FIG. 21 is an internal block diagram of another embodiment of PoP of the invention. The PoP in this embodiment corresponds to the semiconductor device in FIG. 16. This drawing is depicted with a focus on the relation of coupling between the CPU chip 12 and the memory chips 14. In this embodiment, terminals for testing coupled to the memory chips 14 are omitted as in the embodiment illustrated in FIG. 20. That is, the following terminals of the memory chips 14 and the CPU chip 12 are only respectively coupled together: the terminal CKE, terminal CSB, terminal BA[1:0], terminal A[11:0], DQ[31:0], terminal RASB, terminal CASB, terminal WEB, terminal DQS[3:0], DQM[3:0], and CLK and CLKB of the memory chips 14; and the terminals DDRCKE, DDRCS_N, DDRBA[1:0], DDRA[11:0], DDRD[31:0], DDRRAS_N, DDRCAS_N, DDRWE_N, DDRDQS[3:0], DDRRDM[3:0], DDRCK, and DDRCK_N of the CPU chip 12. The other aspects of this configuration are the same as in the device in FIG. 20.

FIG. 22 is a block diagram of an embodiment explaining a performance test for the semiconductor device illustrated in FIG. 21. Similarly with the foregoing, a test board is provided with a clock generation circuit CKG, which supplies a clock signal corresponding to the actual operation of PoP1 to PoPn as devices under test. On the test board, the devices PoP1 to PoPn under test have their JTAG terminals coupled with a tester in common.

In this embodiment, as mentioned above, a performance test for memory chips 14 is conducted using the above-mentioned JTAG and terminals for memory test are unnecessary for the memory chips 14 and omitted. The adoption of the method of manufacturing PoPs including a performance test process for memory chips 14 by CPU chips 12 using the JTAG illustrated in FIG. 14 brings the following advantages: in a PoP manufactured by this method, for example, a number of external terminals can be reduced by so large an amount as approximately 60. This reduction of the number of external terminals makes it possible to reduce the size of the package of the semiconductor device (PoP). More specific description will be given. The above configuration makes unnecessary the solder balls for testing or electrodes for testing provided on the back side of the mounting substrate 13 illustrated in FIG. 16 and wiring for coupling thereto. As a result, the size of the mounting substrate 13 can be reduced.

Further, since a wiring running toward the terminal for memory test, intersecting a wiring coupling the CPU chip 12 and the memory chips 14 together as in the block diagram of FIG. 20 is unnecessary, a number of wiring layers can be accordingly reduced. Therefore, it is possible to use an inexpensive item with a smaller number of wiring layers as the mounting substrate 13 of PoP. Further, it is possible to suppress warp in the mounting substrate 13 due to the difference in coefficient of thermal expansion between a wiring layer and an insulating layer (prepreg). This suppression of warp makes it possible to reduce mechanical stress applied to the solder balls 22 coupling the mounting substrate 13 and the mounting substrate 15 together and couple them together with reliability. It is also possible to significantly reduce the parasitic capacitance between the CPU chip 12 and the memory chips 14. This reduction in parasitic capacitance makes it unnecessary to increase a current at the output circuits of the CPU chip 12 and the memory chips 14 that charge/discharge it, and thus makes it possible to enhance the speed of operation and reduce power consumption.

The above CPU chip 12 has such an interface circuit for user debugging as designated as HUDI (High-performance User Debug Interface) like the microcomputer chips of SH series sold by the present applicant. The HUDI makes it possible to read and write data from and to registers including an internal memory by a small number of pins in compliance with the JTAG standard. Using this interface circuit for user debugging, a memory test program for the memory chips 14 is stored in the internal memory of the CPU chip 12. When this memory test program is executed by the CPU of the CPU chip 12, a performance test on the memory chips is conducted. Needless to add, the interface circuit for user debugging is used to conduct an internal test on the microcomputer chip 2, and this is an intended function of the circuit.

Similarly with that in the SiP, the procedure for wiring the memory test program to the internal memory of the CPU chip 12 and executing it is as follows: (1) bring the CPU into a "reset hold" state; (2) write data to ASERAM; (3) execute "HUDI boot"; (4) write the memory test program to the internal RAM; (5) confirm that the memory test program has been properly written; (6) start the memory test program; and (7) wait for the completion of the memory test and confirm the test result.

To execute the memory test program, it is required to write the memory test program to the internal memory of the CPU chip 12 beforehand. In consideration of the size of the memory test program, the memory test program is written to the internal RAM (e.g., static random access memory) of the CPU chip 12. For example, the above-mentioned SH microcomputer chip is provided with "HUDI write instruction" or "ASERAM write instruction" to write the program to the internal RAM using the HUDI, similarly with the foregoing.

Up to this point, concrete description has been given to the invention made by the present inventors based on its embodiments. However, the invention is not limited to these embodiments and can be variously modified without departing from its subject matter, needless to add. For example, various embodiments can be used as the configuration of the ICE module provided in the microcomputer chip. The interface circuit for starting the ICE module need not be the JTAG and any can be used for this purpose. The memory chip need not be DDR-SDRAM and may be SDRAM or SRAM or any other type of memory chip, such as flash memory (collectively erasable nonvolatile memory), may be mounted. In the example illustrated in FIG. 2, the SiP is so constructed that each chip is mounted over the surface of a mounting substrate. Instead, it may be constructed by assembling multiple chips in laminated structure.

The invention can be widely applied to SiPs and PoPs including a microcomputer chip (CPU chip) and a memory chip, or semiconductor devices in a multichip configuration, and manufacturing methods and testing methods thereof.

What is claimed is:

1. A method of manufacturing a semiconductor device comprising:
a first process of forming a first semiconductor device having a first memory circuit;
a second process of conducting an electrical test on the first semiconductor device to sort non-defective items;
a third process of forming a second semiconductor device having a signal processing circuit carrying out signal processing according to a program and a second memory circuit;
a fourth process of conducting an electrical test on the signal processing circuit and second memory circuit of the second semiconductor device to sort non-defective items;
a fifth process of integrally configuring the first semiconductor device sorted in the second process and the second semiconductor device sorted in the fourth process and coupling together the respective corresponding terminals thereof; and
a sixth process of mounting the semiconductor devices integrally configured in the fifth process over a board for testing, and conducting an electrical test to determine the failure/no-failure of the semiconductor devices,
wherein the board for testing is provided with an oscillation circuit supplying a clock signal equivalent to the actual operation of the semiconductor devices to the semiconductor devices in common, and
wherein the sixth process includes:
a first operation of writing a test program for conducting a performance test on the first memory circuit of the first semiconductor device from a tester to the second memory circuit of the second semiconductor device;
a second operation of conducting a performance test on the first memory circuit of the first semiconductor device according to the test program written to the second memory circuit, in accordance with the clock signal, by the signal processing circuit of the second semiconductor device; and
a third operation of outputting the result of failure/no-failure determination in the second operation to the tester.

2. The method of manufacturing a semiconductor device according to claim 1,
wherein the first process includes a first-first process of forming a plurality of first memory circuits over a first wafer,
wherein the second process includes:
a second-first process of conducting an electrical test on each of the memory circuits formed over the first wafer to determine failure/no-failure; and
a second-second process of dividing the first memory circuits formed over the first wafer into individual first semiconductor chips and sorting the first semiconductor chips determined as non-defective as the result of determination in the second-first process,
wherein the third process includes a third-first process of forming a plurality of semiconductor circuits including a second memory circuit and a signal processing circuit carrying out signal processing according to a program over a second wafer,
wherein the fourth process includes:
a fourth-first process of conducting an electrical test on each of the semiconductor circuits formed over the second wafer to determine failure/no-failure; and
a fourth-second process of dividing the semiconductor circuits formed over the second wafer into individual second semiconductor chips and sorting the second semiconductor chips determined as non-defective as the result of determination in the fourth-first process, and
wherein the fifth process includes a fifth-first process of mounting a first semiconductor chip sorted as non-defective in the second-second process and a second semiconductor chip sorted as non-defective in the fourth-second process over a common substrate to integrally configure a semiconductor device in one package.

3. The method of manufacturing a semiconductor device according to claim 2,
wherein the second semiconductor chip includes a self-diagnosis circuit, and
wherein the first operation in the sixth process includes:
a first step of bringing the second semiconductor chip into a reset hold state and writing a program enabling input of a test program from the tester to a memory circuit provided in the self-diagnosis circuit; and
a second step of writing the test program to the second memory circuit according to the program.

4. The method of manufacturing a semiconductor device according to claim 2,
wherein the board for testing used in the sixth process has a plurality of sockets in which a plurality of semiconductor devices can be mounted, and
wherein a clock generated in the oscillation circuit is supplied to the semiconductor devices attached to the sockets in common.

5. The method of manufacturing a semiconductor device according to claim 3,
wherein the second semiconductor chip includes a user debugging interface circuit in compliance with the JTAG standard, and
wherein in the sixth process, coupling with the tester is achieved using the user debugging interface circuit and input of a test program in the first operation and output of the result of determination in the third operation are carried out.

6. The method of manufacturing a semiconductor device according to claim 5,
wherein in the fifth-first process, the common substrate has an internal wiring coupling together the corresponding terminals of the first semiconductor chip and second semiconductor chip, and
wherein the internal wiring is not coupled to an external terminal of the integrally configured semiconductor device.

7. The method of manufacturing a semiconductor device according to claim 6,
wherein the first semiconductor chip is a dynamic RAM; and
wherein the second semiconductor chip is a microcomputer having an interface circuit that can be directly coupled with the dynamic RAM.

8. The method of manufacturing a semiconductor device according to claim 1,
wherein the first process includes:
a first-first process of forming a plurality of first memory circuits over a first wafer;
a first-second process of conducting an electrical test on each of the memory circuits formed over the first wafer to determine failure/no-failure;
a first-third process of dividing the first memory circuits formed over the first wafer into individual first semiconductor chips and sorting the first semiconductor chips determined as non-defective as the result of determination in the first-second process; and a first-fourth process of assembling the first semiconductor device having solder balls as external terminals based on the first semiconductor chips determined as non-defective in the first-third process, wherein the second process includes a second-first process of conducting an electrical test involving the first memory circuit of the first semiconductor device assembled in the first-fourth process to sort non-defective items, wherein the third process includes:

a third-first process of forming over a second wafer a plurality of semiconductor circuit including a second memory circuit and a signal processing circuit carrying out signal processing according to a program;

a third-second process of conducting an electrical test on each of the semiconductor circuits formed over the second wafer to determine failure/no-failure;

a third-third process of dividing the semiconductor circuits formed over the second wafer into individual second semiconductor chip and sorting the second semiconductor chips determined as non-defective as the result of determination in the third-second process; and a third-fourth process of mounting a second semiconductor chip determined as non-defective in the third-third process over a mounting substrate having coupling electrodes corresponding to solder balls of the first semiconductor device to assemble the second semiconductor device, wherein the fourth process includes a fourth-first process of conducting an electrical test involving the second memory circuit of the second semiconductor device assembled in the third-fourth process to sort non-defective items, and wherein the fifth process includes a fifth-first process of coupling solder balls of a first semiconductor device sorted as non-defective in the second-first process to the corresponding coupling electrodes of a second semiconductor device sorted as non-defective in the fourth-first process to integrally assemble one semiconductor device.

9. The method of manufacturing a semiconductor device according to claim 8, wherein the second semiconductor device includes a self-diagnosis circuit, and wherein the first operation in the sixth process includes:

a first step of bringing the second semiconductor chip into a reset hold state and writing a program enabling input of a test program from the tester to a memory circuit provided in the self-diagnosis circuit; and a second step of writing the test program to the second memory circuit according to the program.

10. The method of manufacturing a semiconductor device according to claim 9, wherein the board for testing used in the sixth process has a plurality of sockets in which a plurality of semiconductor devices can be mounted, and wherein a clock generated in the oscillation circuit is supplied to the semiconductor devices attached to the sockets in common.

11. The method of manufacturing a semiconductor device according to claim 10, wherein the second semiconductor device includes a user debugging interface circuit in compliance with the JTAG standard, and wherein in the sixth process, coupling with the tester is achieved using the user debugging interface circuit and input of a test program in the first operation and output of the result of determination in the third operation are carried out.

* * * * *